(12) United States Patent
Pajovic et al.

(10) Patent No.: US 10,921,383 B2
(45) Date of Patent: Feb. 16, 2021

(54) BATTERY DIAGNOSTIC SYSTEM FOR ESTIMATING CAPACITY DEGRADATION OF BATTERIES

(71) Applicant: Mitsubishi Electric Research Laboratories, Inc., Cambridge, MA (US)

(72) Inventors: Milutin Pajovic, Cambridge, MA (US); Philip Orlik, Cambridge, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 90 days.

(21) Appl. No.: 16/295,078

(22) Filed: Mar. 7, 2019

(65) Prior Publication Data

US 2020/0284846 A1    Sep. 10, 2020

(51) Int. Cl.
| | |
|---|---|
| *H01M 6/24* | (2006.01) |
| *G01R 31/396* | (2019.01) |
| *G01R 31/392* | (2019.01) |
| *G06N 20/00* | (2019.01) |
| *G06F 30/20* | (2020.01) |
| *G06N 5/04* | (2006.01) |
| *H01M 10/42* | (2006.01) |

(52) U.S. Cl.
CPC ......... *G01R 31/396* (2019.01); *G01R 31/392* (2019.01); *G06F 30/20* (2020.01); *G06N 5/04* (2013.01); *G06N 20/00* (2019.01); *H01M 10/4285* (2013.01)

(58) Field of Classification Search
CPC ......... H01M 10/4285; H01M 10/4271; H01M 10/4278; H01M 10/42; H01M 10/425; H01M 10/4257; H01M 10/446; H01M 10/44; G01R 31/396; G01R 31/392; G06N 20/00; G06N 5/04; G06F 30/20
See application file for complete search history.

(56) References Cited

U.S. PATENT DOCUMENTS

| | | | | |
|---|---|---|---|---|
| 9,559,390 | B2 * | 1/2017 | Duan | B60L 1/003 |
| 10,566,815 | B2 * | 2/2020 | Fujita | H02J 7/007 |
| 10,668,812 | B2 * | 6/2020 | Migita | H02M 7/537 |

FOREIGN PATENT DOCUMENTS

WO    WO 2017-038749    *    9/2017    ............. G01R 31/36

* cited by examiner

*Primary Examiner* — Raymond Alejandro
(74) *Attorney, Agent, or Firm* — Gennadiy Vinokur; James McAleenan; Hironori Tsukamoto

(57) ABSTRACT

A battery diagnostic system stores capacity degradation models for batteries of a specific type mapped to sets of battery cycle models formed by voltages and/or currents measured at different capacities. Each capacity degradation model is mapped to a set of battery cycle models associated with different battery capacities. The system, upon accepting measurements indicative of a battery cycle and a current capacity of the test battery, compares the battery cycle of the test battery with the battery cycle models of different capacity degradation models associated with a value of the battery capacity closest to the current capacity of the test battery to select a battery cycle model closest to the battery cycle of the test battery and the degradation capacity model mapped to the selected battery cycle model. The system estimates future degradation of the capacity of the test battery based on the retrieved capacity degradation model.

8 Claims, 20 Drawing Sheets

BATTERY DIAGNOSTIC SYSTEM FOR ESTIMATING CAPACITY DEGRADATION OF BATTERIES

TECHNICAL FIELD

This invention generally relates to a battery diagnostic system, and more specifically to battery diagnostic system for estimating capacity degradation of batteries.

BACKGROUND

Rechargeable batteries provide power supply to numerous systems and applications, most prominent examples of which include electric vehicles (EV), consumer electronic devices, uninterrupted power supply (UPS) systems and photo-voltaic (PV) cells. Battery management system (BMS) monitors and manages operation of the associated battery based on measurements from a variety of sensors it employs. The monitoring of a battery is conventionally comprised of estimation of its state of charge (SoC), state of health (SoH) and state of power (SoP), which have been in the research focus over the past years. More recently, predicting battery state of degradation (SoD) and the related remaining useful life (RUL) has recently started to gain research interest as a more useful metric.

One of the indication of a state of health of a battery is related to predicting how battery's capacity degrades over future time horizon. The capacity of a battery is measured by the amount of charge (expressed in Ah) the battery can store and deliver to its load. For example, a capacity 10 Ah means that the battery can deliver to its load a constant current 10 A during 1 h. The capacity of a battery decreases over time due to its aging and the degradation pattern depends on its usage, chemistry and manufacturer. Once the capacity degrades to a certain level the battery may need to be replaced. Not replacing battery on time leads to battery failure and power disruption, causing a variety of application-specific issues. Therefore, predicting how battery capacity evolves over time, can help to avoid power disruption.

One method for predicting capacity degradation is to model capacity evolution over time using an empirical model, such as a decaying exponential. The model parameters are tracked by using an adaptive filter, such as particle filer, based on capacity measurements over discharge cycles. The capacity evolution over future time horizon is predicted by extrapolating empirical model using the most recent values of model parameters. One limitation of this method is that the battery needs to be fully charged and discharged over its operation so that its capacity can be measured in each cycle.

A data-driven approach is based on discharge voltage measurements taken over lifetimes of one or more batteries sharing the same chemistry and manufacturer, and undergoing a fixed, pre-defined usage pattern. The remaining useful life of a battery under test in the operational stage is predicted based on the training data and measurement of its voltage during the most recent discharge cycle. While this approach does not necessarily rely on capacity measurements, meaning that the battery does not need to be fully charged and discharged, this method has a limitation requiring that the tested battery has to be of the same manufacturer and chemistry, as well as to undergo the same usage pattern as the batteries from the training data. In other words, a separate training dataset is needed for each possible usage pattern of a battery of given manufacturer and chemistry which makes this approach less practical.

Accordingly, there is a need for a battery diagnostic system that can estimate future degradation of the capacity of batteries undergoing various usage patterns.

SUMMARY

It is an object of some embodiments to disclose a data-driven method for estimating capacity evolution of a battery over future time horizon. It is an object of some embodiments to train the data-driven method using training dataset of capacity, voltage and current measurements taken under the same conditions of a certain number of batteries of the same type, e.g., sharing the same chemistry and manufacturer. It is an object of some embodiments to train the data-driven method using measurements taken over a period of time, e.g., over several years, of the batteries that undergo different usage patterns.

For example, in some embodiments, the training batteries can be used in different manners and the training dataset measurements are occasionally taken under the same conditions that force the batteries to get fully charged and discharged so as to obtain their capacity measurements. Such an approach allows to use the same conditions to measure, in the operational stage, capacity and other measurements of a test battery (of the same chemistry and manufacturer) of unknown previous usage pattern and to predict capacity degradation of the test battery over future charge-discharge cycles. Notably, the measurement condition for a test battery can be controlled, while the usage pattern of a test battery is usually unknown.

To that end, it is an object of some embodiment to determine capacity degradation of a battery over a future predication horizon. Some embodiments are based on recognition that it is possible to model capacity degradation of a battery of the same type as the battery of interest over time using empirical data collected from different batteries of the same type. If such a capacity degradation model is known, the capacity degradation over time can be selected from this model. For example, the future capacity degradation can be selected starting from the current, e.g., measured, capacity value of a battery over a desired prediction horizon.

However, some embodiments are based on realization that capacity degradation differs even among batteries of the same type due to slight, unobservable differences during their manufacturing as well as different battery usage pattern. In other words, a battery of a specific type belongs to a degradation class that can differ from a degradation class of another battery of the same type. Hence, the capacity degradation model determined from data collected from batteries of a specific type (but having one degradation class) may be inaccurate for other batteries of the same type (but having a different degradation class). The degradation class of a test battery under the consideration is often unknown.

Some embodiments are based on realization that different capacity degradation models determined for batteries of the same type can be clustered in a finite number of clusters. Each cluster can average and/or represent a degradation class of the batteries of a specific type. Hence, the problem of determining the right capacity degradation model for a specific battery is reduced to a problem of determining a degradation class of the battery and selecting (from the finite set of models) the capacity degradation model determined for the same degradation class.

To that end, some embodiments address another problem: if there are many different degradation classes for batteries of the same type, even if all or some of those capacity degradation models are determined in advance, how to determine a degradation class of a test battery and/or the right capacity degradation model for the test battery in a computationally efficient manner. Hence, the mentioned above technical problem is reduced to a specific technical problem of how to determine a degradation class of a test battery based on the measurements of parameters of the battery.

Some embodiments are based on empirical discovery that voltage of a battery, e.g., a tail voltage, depends not only on current capacity of the battery but also on degradation class of the battery. Hence, it is possible to determine offline, using empirical data collected from different batteries of the same type and measured at different battery capacities, a mapping between the voltages and the degradation classes. Having this mapping, the degradation class can be selected for measured voltages. Knowing the degradation class, the capacity degradation model corresponding to that degradation class can be selected and used for determining capacity degradation of the battery over future period of time.

In effect, this approach allows not to assume that batteries of the same chemistry and manufacturer exhibit the same degradation pattern, but instead learn possible capacity degradation traces from the training data during model learning stage. A tested battery is classified into one of possible degradation classes based on voltage and capacity measurements during one discharge cycle and its capacity evolution is accordingly predicted. Due to such a classification, the experimental validation reveals that some embodiments can predict capacity of a test battery cell over future time horizon of hundreds of days with relative prediction error below 1%.

Accordingly, one embodiment discloses a battery diagnostic system, that includes a memory configured to store a set of capacity degradation models for batteries of a specific type, each capacity degradation model defines degradation of a battery capacity as a function of time, mapped to sets of battery cycle models formed by values of one or combination of voltages and currents measured for the batteries of the specific type at different capacities during one or combination of a charging cycle and a discharging cycle, such that each capacity degradation model is mapped to a set of battery cycle models associated with different battery capacities; an input interface configured to accept measurements indicative of a battery cycle of a test battery and a current capacity of the test battery; a processor configured to compare the battery cycle of the test battery with the battery cycle models of different capacity degradation models associated with a value of the battery capacity closest to the current capacity of the test battery to select at least one battery cycle model closest to the battery cycle of the test battery; retrieve from the memory the degradation capacity model mapped to the selected battery cycle model; and estimate future degradation of the capacity of the test battery based on the retrieved capacity degradation model; and an output interface configured to output the estimated future degradation of the capacity of the test battery.

Another embodiment discloses a battery diagnostic method, wherein the method uses a processor coupled to a memory storing a set of capacity degradation models for batteries of a specific type, each capacity degradation model defines degradation of a battery capacity as a function of time, mapped to sets of battery cycle models formed by values of one or combination of voltages and currents measured for the batteries of the specific type at different capacities during one or combination of a charging cycle and a discharging cycle, such that each capacity degradation model is mapped to a set of battery cycle models associated with different battery capacities, wherein the processor is coupled with stored instructions implementing the method, wherein the instructions, when executed by the processor carry out at least some steps of the method. The method includes accepting measurements indicative of a battery cycle of a test battery and a current capacity of the test battery; comparing the battery cycle of the test battery with the battery cycle models of different capacity degradation models associated with a value of the battery capacity closest to the current capacity of the test battery to select at least one battery cycle model closest to the battery cycle of the test battery; retrieving from the memory the degradation capacity model mapped to the selected battery cycle model; estimating future degradation of the capacity of the test battery based on the retrieved capacity degradation model; and outputting the estimated future degradation of the capacity of the test battery.

Yet another embodiment discloses a non-transitory computer readable storage medium embodied thereon a program executable by a processor for performing a method, wherein the medium stores a set of capacity degradation models for batteries of a specific type, each capacity degradation model defines degradation of a battery capacity as a function of time, mapped to sets of battery cycle models formed by values of one or combination of voltages and currents measured for the batteries of the specific type at different capacities during one or combination of a charging cycle and a discharging cycle, such that each capacity degradation model is mapped to a set of battery cycle models associated with different battery capacities. The method includes accepting measurements indicative of a battery cycle of a test battery and a current capacity of the test battery; comparing the battery cycle of the test battery with the battery cycle models of different capacity degradation models associated with a value of the battery capacity closest to the current capacity of the test battery to select at least one battery cycle model closest to the battery cycle of the test battery; retrieving from the memory the degradation capacity model mapped to the selected battery cycle model; estimating future degradation of the capacity of the battery based on the retrieved capacity degradation model; and outputting the estimated future degradation of the capacity of the test battery.

DETAILED DESCRIPTION

Rechargeable batteries supply numerous devices with electric power and are critical part in a variety of applications. An accurate monitoring and prediction of capacity degradation is an important problem and directly related to making timely decision as to when a battery should be replaced so that power disruption of the system it supplies power to is avoided. Some embodiments disclose a methodology for predicting capacity of a battery over future time horizon. The proposed method is based on training data of occasionally taken measurements, under the same conditions, of capacity and charge/discharge voltage/current of a certain number of batteries sharing the same chemistry and manufacturer, that otherwise undergo different usage patterns. In the operational/online stage, capacity degradation over future time horizon of a test battery cell of unknown state of health and previous usage pattern is predicted based on its capacity and voltage/current measurements over one charge/discharge cycle and the training dataset.

Figure 1A:
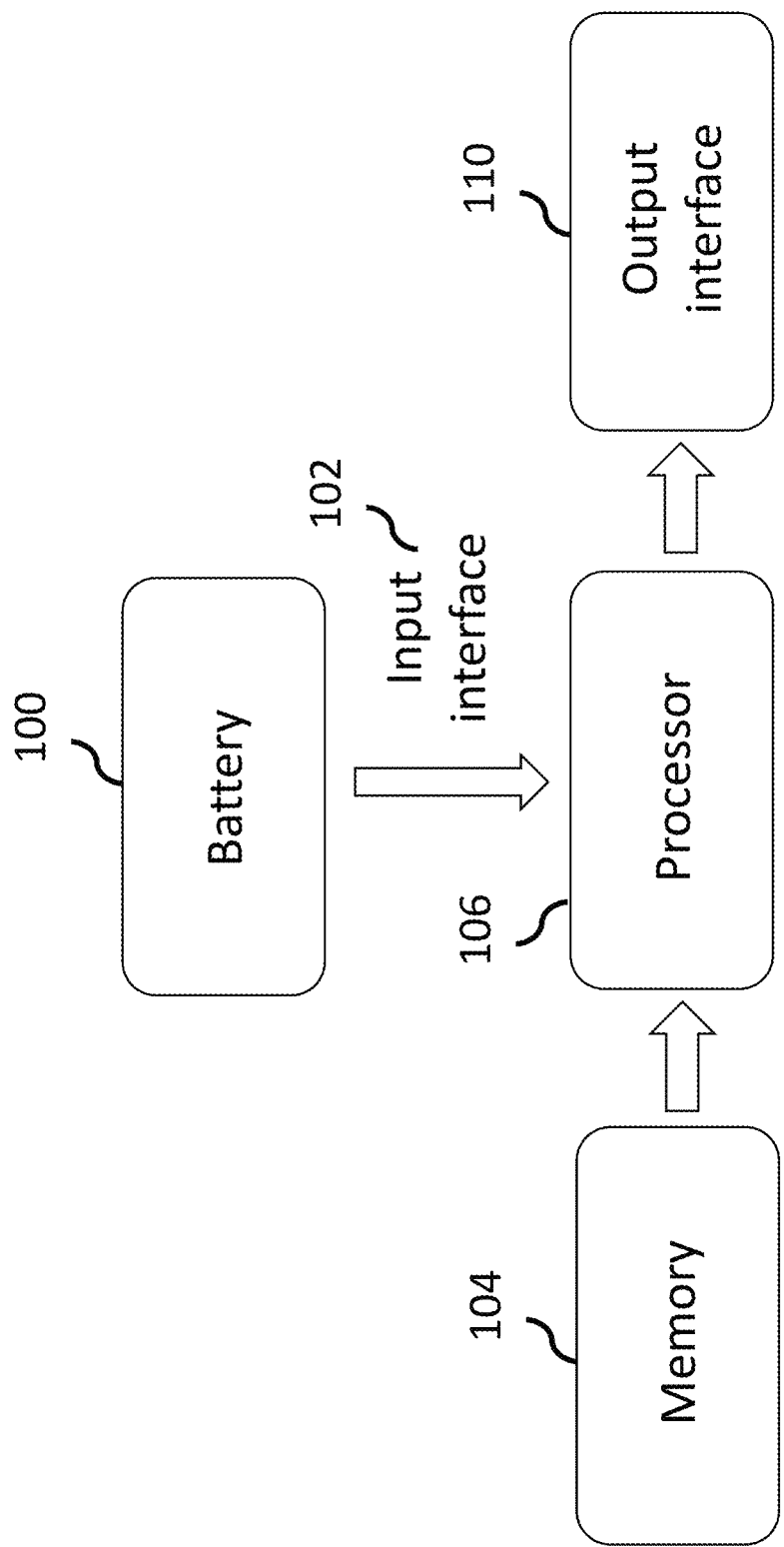
FIG. 1A is shows a principle block diagram of a battery diagnostic system according to some embodiments.

FIG. 1A shows a principle block diagram of a battery diagnostic system according to some embodiments. A test battery 100 is supplying a certain system or application and undergoes a usage pattern including a sequence of charge and discharge cycles. The battery diagnostic system estimates how the capacity of the test battery 100 evolves over future time horizon. The capacity of a battery is the maximum amount of charge the battery can store and deliver to its load. The capacity of a battery is also related to and often referred to as the state of health (SoH). The capability of a battery to hold charge diminishes over time, which is referred herein as a battery capacity degradation.

An input interface 102 is configured to accept measurements indicative of a battery cycle of a test battery and a current capacity of the test battery. As used herein a battery cycle is formed by values of one or combination of voltages and currents measured for a battery during one or combination of a charging cycle and a discharging cycle. To that end, the battery cycle is a charging cycle, a discharging cycle, or combination thereof. The battery cycle can be represented by measurements of voltage, current or combination thereof. For example, one embodiments uses voltage measurements of discharging cycles, also refereed as "tail voltage." For clarity of this disclosure, the tail voltage can be used throughout, but skilled artisan would readily understand, that the tail voltage can be replaced with any other representation of a battery cycle.

Similarly, the measurements indicative of the current capacity of the test battery can be the measurements of the capacity or any other measurements from which the capacity can be readily derived. For example, assuming the battery was fully charged in the previous charging cycle, the current measured during the following discharging cycle is used to compute current capacity of the battery. Namely, the capacity is proportional to the integral of the discharge current over time, where the constant of proportionality depends on battery type. Analogously, assuming the battery was fully discharged in the previous discharging cycle and gets fully charged in the current charging cycle, its capacity is proportional to the integral of the charge current over time during the charging cycle, with the same constant of proportionality depending on the battery type. Alternatively, the capacity may be determined by other means, or even directly measured. Overall, the tail voltage and capacity corresponding to a discharge cycle are inputs to processor 106 according to some embodiments. In some other embodiments, other measurements may be inputs to the processor, as detailed later.

In addition to tail voltage and capacity measurements, the processor is in connection with memory unit 104 which stores battery models, learned in the training stage. More specifically, the memory stores a certain number of capacity degradation models imminent to the batteries of the same chemistry and, possibly, manufacturer. Each capacity degradation model is one possible capacity evolution over time of the battery of the same chemistry/manufacturer and represents one possible degradation class. Also, the memory stores a mapping between each degradation class and values of voltages measured for the batteries of the specific type at different capacities. Examples of the mapping include a voltage model for each pair of degradation class and capacity value or a mapping between a voltage measured for a specific capacity and the degradation class. The number of degradation classes, their representative capacity degradation models and voltage models are learned from capacity and tail voltage measurements taken over some time period comprising of numerous charge-discharge cycle of a number of batteries of the same chemistry/manufacturer.

The processor 106 implements a battery diagnostic system according to some embodiments to estimate future capacity degradation of the battery 100. The processor 106 retrieves the capacity degradation model of the test battery 100 from the mapping corresponding to the measured tail voltage. For example, the processor 106 extracts from the memory 104 tail voltage models corresponding to all degradation classes. Additionally, or alternatively, the processor 106 extracts from the memory 104 battery cycles models, e.g., tail voltage models, corresponding to all degradation classes and associated with the same capacity as the current capacity received by the input interface 102. This embodiment reduces the computation complexity. Then, the processor 106 compares the measured tail voltage of the tested battery with the extracted tail voltage models from the memory by computing similarity score between the measured tail voltage and each tail voltage model from the memory.

The processor selects at least one battery cycle model closest to the battery cycle of the test battery and retrieves from the memory the degradation capacity model mapped to the selected battery cycle model. In one embodiment, the selection is done by extracting from the memory the capacity degradation model of the battery cycle model corresponding to the largest similarity score. Additionally, or alternatively, multiple battery cycle models can be equally similar to the measured voltage. To that end, one embodiment provides a weighted combination of all capacity degradation models from the memory whose weights are equal or similar, i.e., less than a threshold, to the computed similarity scores. Next, the processor estimates future capacity degradation of the battery, e.g., starting from the current capacity of the battery according to the selected capacity degradation model. In other words, the segment of the selected capacity model starting from the measured capacity and going forward in time is the predicted capacity of the tested battery. The output interface 110 outputs the predicted capacity of the tested battery.

In effect, some embodiments predict capacity evolution of a test battery whose state of health and previous usage pattern are unknown. This is done based on voltage/current and capacity measurements over one charge/discharge cycle. An application of the disclosed method is to estimate capacity degradation of a battery cell purchased on a secondary battery market based on capacity/voltage/current measurements during one charge and/or discharge cycle. The prediction is aided by the training dataset that contains capacity/voltage/current measurements of a certain number of battery cells. Those battery cells share the same manufacturer and chemistry, but undergo different usage patterns. However, training dataset measurements are taken at occasional charge and discharge cycles when all train battery cells are fully charged and discharged under the same conditions. Those same conditions are used to take measurements of the test battery cell.

Some embodiments provide data-driven method to produce capacity degradation models and battery cycle models adapted for different usage pattern. For example, some embodiments use training batteries in different manners while occasionally performing measurements under the same conditions that force the batteries to get fully charged and/or discharged so as to obtain their capacity measurements. Such an approach allows to use the same conditions to measure, in the operational stage, capacity and other measurements of a test battery (of the same chemistry and manufacturer) of unknown previous usage pattern and to predict capacity degradation of the test battery over future charge-discharge cycles. Notably, the measurement condition for a test battery can be controlled, while the usage pattern of a test battery is usually unknown.

Some embodiments are based on recognition that it is possible to model capacity degradation of a battery of the same type as the battery of interest over time using empirical data collected from different batteries of the same type. If such a capacity degradation model is known, the capacity degradation over time can be selected from this model. For example, the future capacity degradation can be selected starting from the current, e.g., measured, capacity value of a battery over a desired prediction horizon.

For example, one embodiment uses an experimental dataset to validate and assess the performance of the disclosed method. The dataset includes thirteen battery cells (labeled Cell 6, Cell 7, . . . , Cell 18) of the same manufacturer and chemistry undergo different usage patterns over a time period of few years. The cells are tested on up to 43 random occasions during that time period under the same conditions. The tests comprise of charging each cell with constant current (CC) 1 A until the voltage on its terminals reaches 4.2 V. The voltage is then kept constant (i.e., this is a floating voltage of the cell) until the current falls to 0.05 A, which concludes the charging cycle. The cell is discharged with constant current (CC)−1 A until the voltage on its terminals falls to 3 V. During the testing, current, voltage, ambient and inner temperatures of the cells (or some subset of them) are recorded over 12-hour time interval.

Figure 1B:
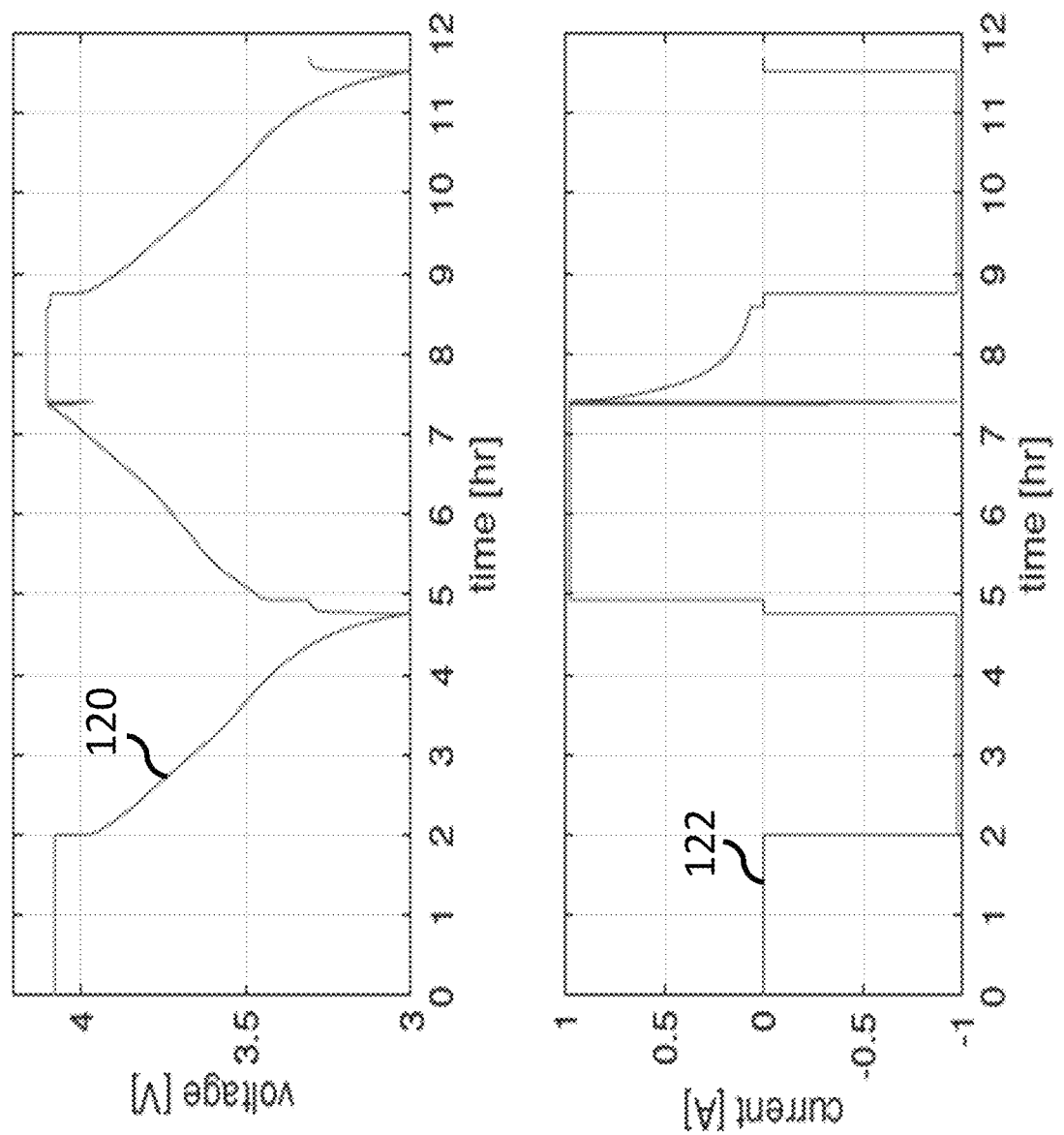
FIG. 1B shows charge/discharge current/voltage used to take training and test data measurements according to one embodiment.

FIG. 1B shows charge/discharge current/voltage used to take training and test data measurements according to one embodiment. FIG. 1B shows the recorded current 122 and voltage 120 waveforms of one cell on one such occasion. The amount of charge a cell stores/delivers during a charge/discharge cycle is computed as the time integral of the charge/discharge current over the charge/discharge cycle, where the constant of proportionality depends on the cell's chemistry. The capacity of the battery or state of health (SoH) of a cell, C(t), is defined as the maximum amount of charge it can deliver to its load during a discharge cycle ending at time t after it has been fully charged in the preceding charging cycle. Given that all cells in the dataset are tested under the same charge/discharge conditions that aim to (almost) fully charge/discharge them, the measured charge each cell delivers during its test discharge cycle is considered as its capacity associated with the time instant that cycle ends.

Figure 1C:
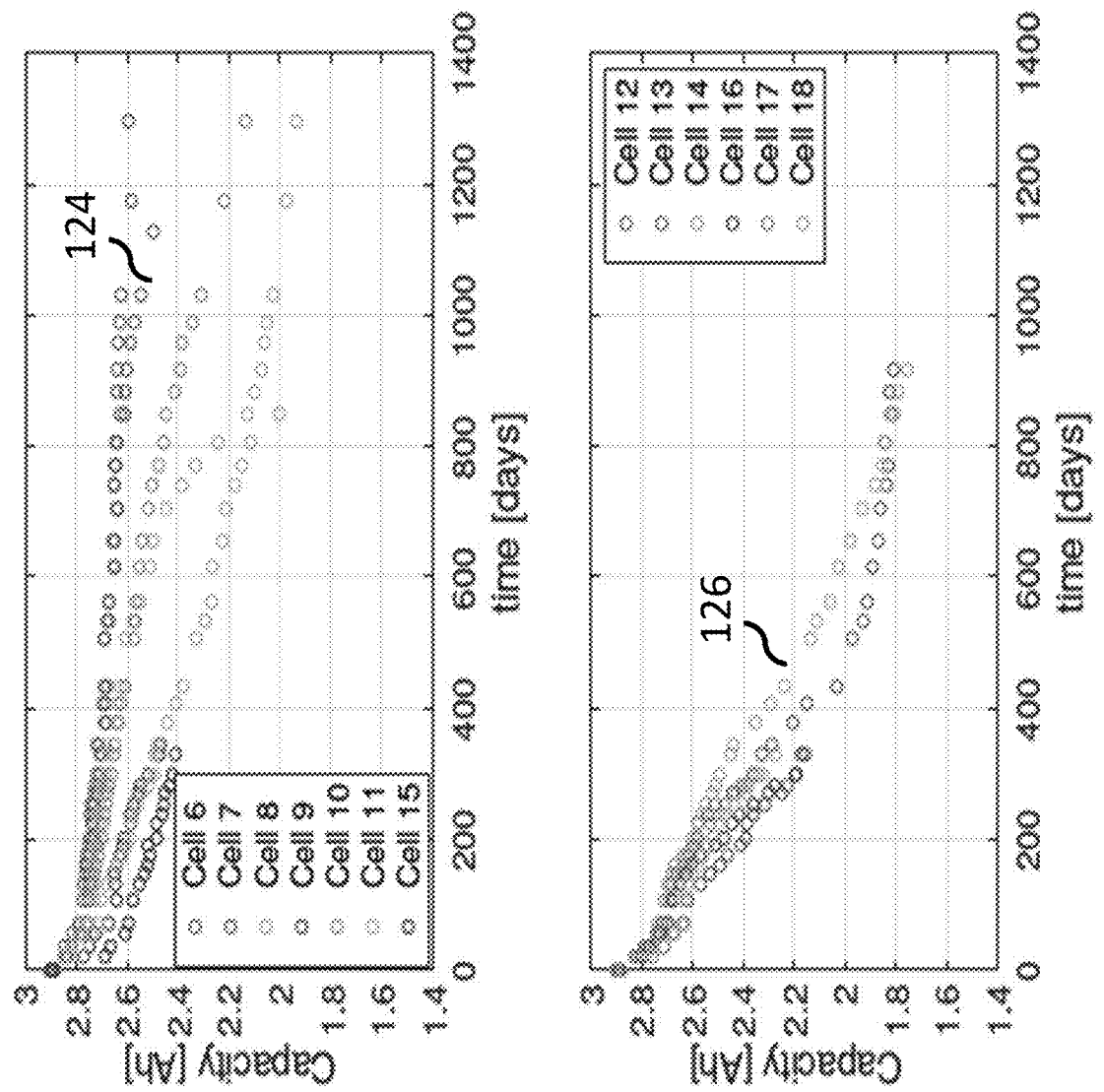
FIG. 1C shows capacity measurements during test discharge cycles of battery cells in our dataset.

FIG. 1C shows capacity evolution of battery cells from a dataset used by one embodiment. In some implementations, capacity of a cell is reported at the end of the last discharge cycle within the 12-hr time period the voltage/current/temperature measurements of the cell were taken. For example, the capacities 124, 126 of the examined cells exhibit quite different behavior over time. While some cells are fairly heathy and last over a large number of charge-discharge cycles, some other cells relatively quickly degrade. This implies that despite sharing the same chemistry and manufacturer, the cells exhibit different degradation patterns due to distinct usage patterns.

Figure 1D:
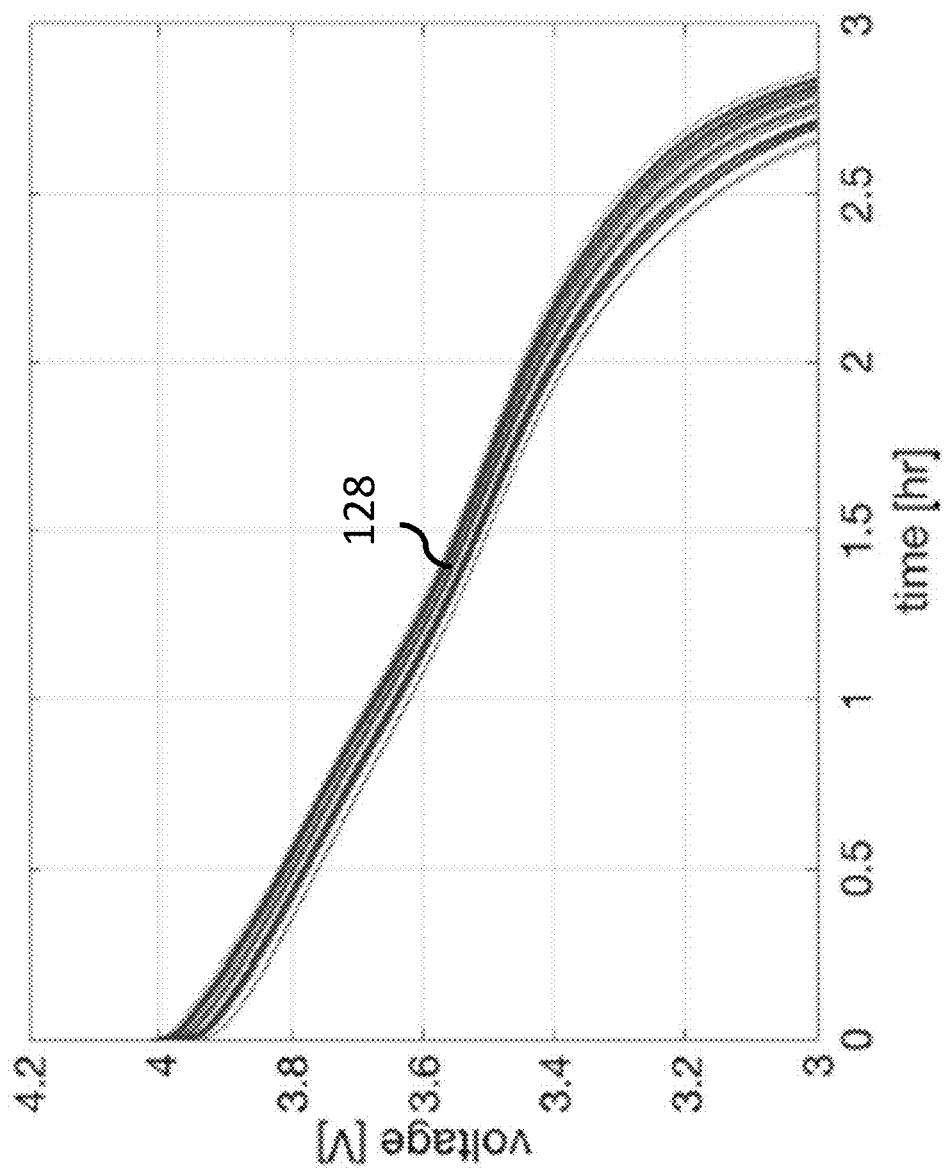
FIGS. 1D and 1E show tail voltages of two battery cells from a dataset used by one embodiment.
Figure 1E:
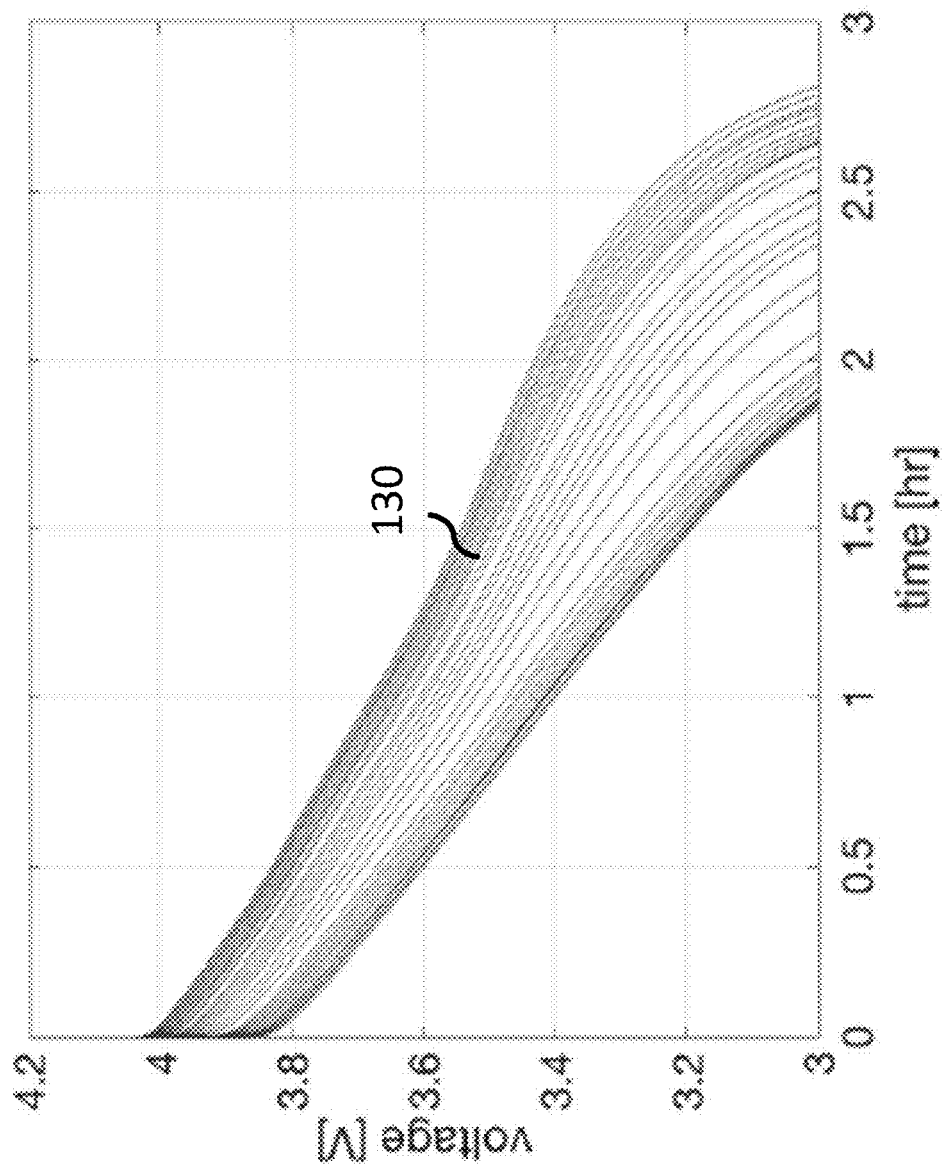

FIGS. 1D and 1E show tail voltages of two battery cells from a dataset used by one embodiment. Similarly, to different degradation patterns of FIG. 1C, the voltage waveforms measured during discharge cycles, referred to as the tail voltages, are also vary. For example, tail voltages of Cell 6 128 and Cell 13 130, shown in FIGS. 1D and 1E, present quite distinct features indicating that those two cells are impacted by quite different degradation mechanisms. Notably, the same effect can be observed from the voltage waveforms measured during charge cycles.

To that end, some embodiments are based on empirical discovery that voltage of a battery, e.g., a tail voltage, depends not only on current capacity of the battery but also on degradation class of the battery. Hence, it is possible to determine offline, using empirical data collected from different batteries of the same type and measured at different battery capacities, a mapping between the voltages and the degradation classes. Having this mapping, the degradation class can be selected for measured voltages. Knowing the degradation class, the capacity degradation model corresponding to that degradation class can be selected and used for determining capacity degradation of the battery over future period of time.

In effect, this approach allows not to assume that batteries of the same chemistry and manufacturer exhibit the same degradation pattern, but instead learn possible capacity degradation traces from the training data during model learning stage. A tested battery is classified into one of possible degradation classes based on voltage and capacity measurements during one discharge cycle and its capacity evolution is accordingly predicted. Due to such a classification, the experimental validation reveals that some embodiments can predict capacity of a test battery cell over future time horizon of hundreds of days with relative prediction error below 1%.

For example, as seen in FIG. 1C, the examined battery cells experience fairly different capacity degradation patterns over time. In general, a battery cell is a complex physical and chemical system which is susceptible to a variety of degradation patterns. Different degradation patterns of two cells of the same chemistry and manufacturer are mostly due to different manners the cells are used and handled. While, in principle, one may try to discern all possible degradation patterns along with their causes, this would be an exceedingly challenging task. Instead, possible degradation patterns can be obtained by measuring capacities of a number of cells over longer time period. Each distinct degradation pattern is effectively one possible degradation class a battery cell of a given chemistry and manufacturer can undergo. In other words, each battery cell n is associated with a specific degradation class d such that its capacity at time t is modelled as $$C_n(t) = C_n(t; d) \quad (1)$$

Additional information about degradation of a battery cell is obtained from its tail voltages. As indicated in FIGS. 1D and 1E, distinct degradation classes result in different tail voltage curves. This means that tail voltages of two cells associated with different degradation classes, differ even when they are recorded during discharge cycles at which the two cells have the same capacity (i.e., deliver the same amount of charge).

Figure 2A:
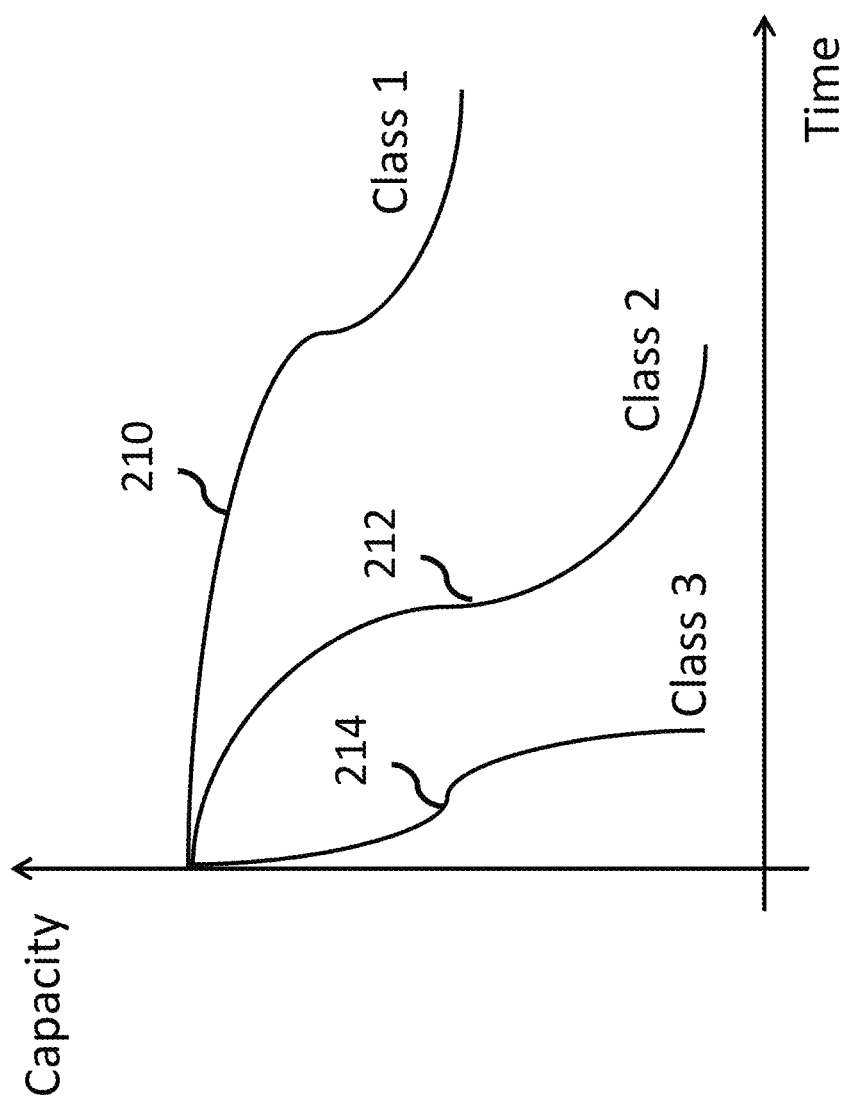
FIG. 2A shows an illustration of capacity traces corresponding to three degradation classes according to some embodiments.

FIG. 2A shows an illustration of capacity traces 210, 212 and 214 corresponding to three degradation classes—Class 1, Class 2 and Class 3, respectively, according to some embodiments.

Figure 2B:
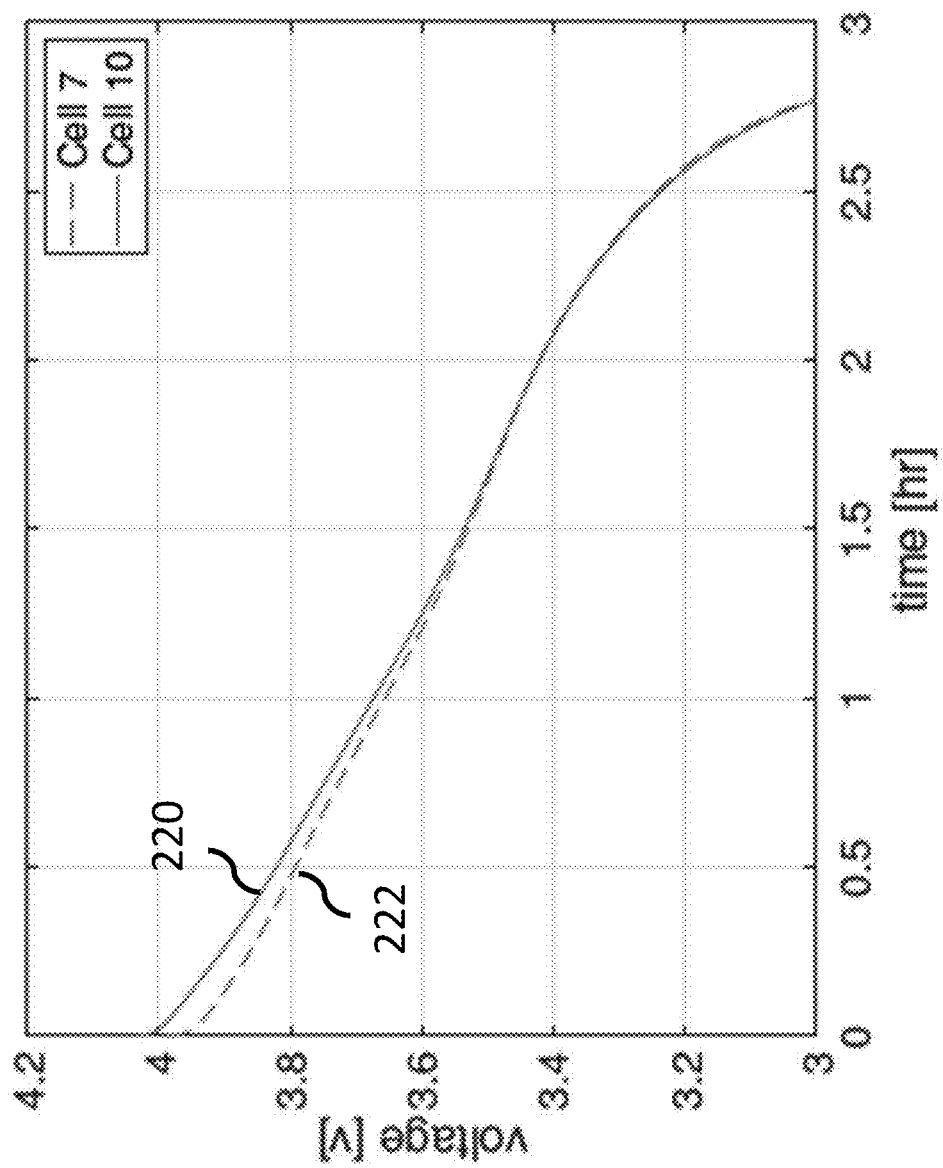
FIG. 2B shows an illustration of tail voltages measured according to some embodiments.

FIG. 2B shows tail voltages 220, 222, of, respectively, Cell 7 and Cell 10 measured according to some embodiments. In this example, the tail voltages are recorded when both cells have the same capacity of 2.55 Ah. As a side remark, the durations of the respective discharge cycles are the same because both cells are discharged with CC–1 A. This observation implies that the tail voltage of a cell n depends on its degradation class d and capacity (i.e., state of health) at the corresponding discharge cycle, $$V_n(\tau) = V_n(\tau; d, C_n), \quad (2)$$

where $\tau$ is a "local" time during discharge cycle. In comparison, t refers of "global" time and can also be though of a discharge cycle index. Although the dependance of tail voltage on degradation class is implicit from Eq. (1), it is made explicit in Eq. (2).

Figure 2C:
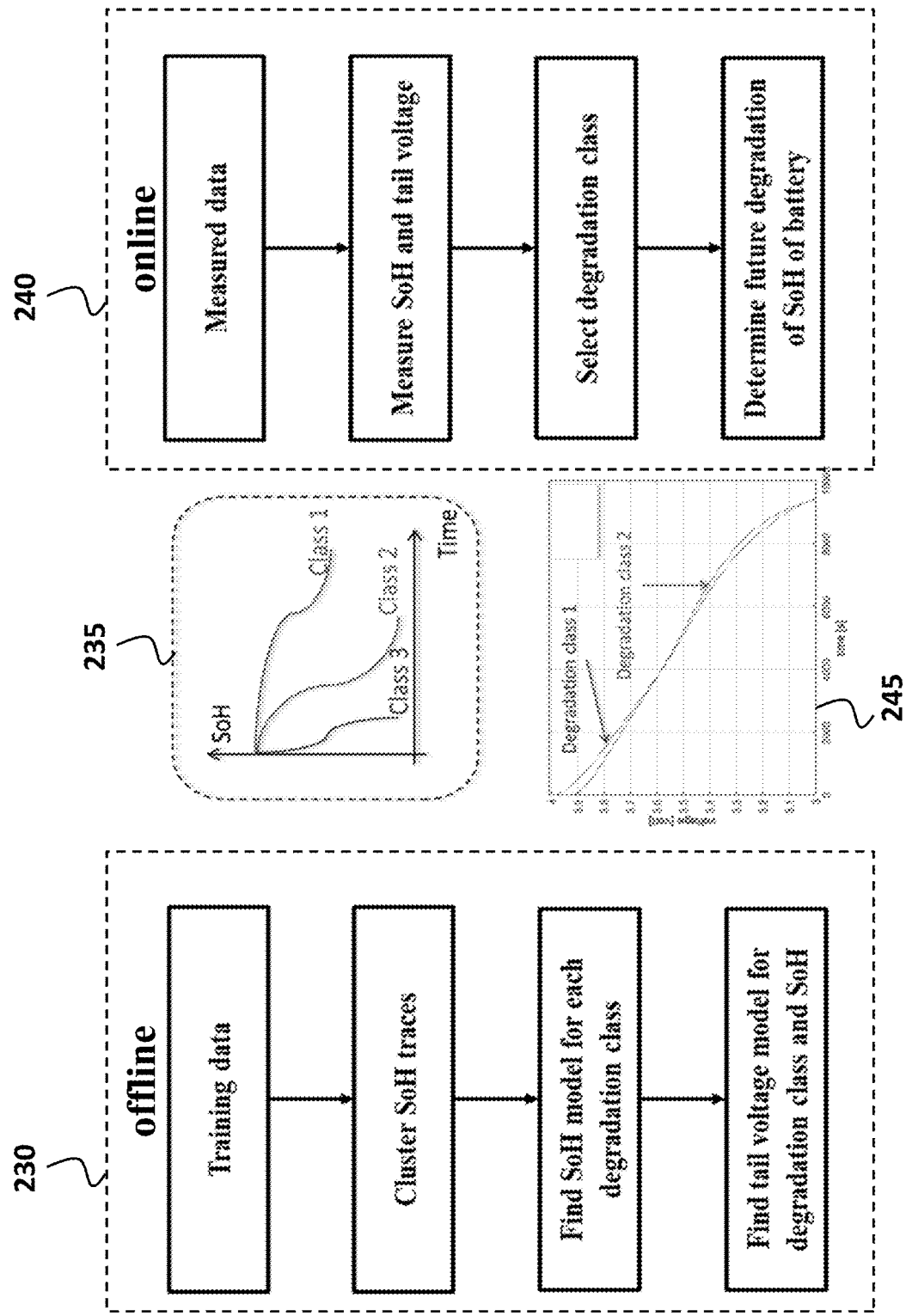
FIG. 2C shows a schematic illustrating offline and online methodology used by some embodiments.

FIG. 2C shows a schematic illustrating offline and online methodology used by some embodiments. During the offline stage 230, some embodiments use training data to determine a set of capacity degradation models 235 mapped to sets of battery cycle models 245. Each capacity degradation model 235 defines degradation of a battery capacity as a function of time. Each capacity degradation model 235 is mapped to a set of battery cycle models 245 associated with different battery capacities.

During the online stage 240, some embodiments select based on measurements indicative of a battery cycle of a test battery and a current capacity of the test battery, at least one predetermined battery cycle model 245 closest to the battery cycle of the test battery. The capacity degradation model 235 associated with the selected battery cycle model 235 is used to estimate capacity degradation of a battery cell over future time horizon. In some embodiments, as indicated above, the data-driven methodology relies on the measurements of battery cells of the same type, e.g., sharing the same chemistry and manufacturer, recorded over a number of charge-discharge cycles. The proposed methodology comprises of model learning and online prediction described in more details below.

Model Learning

Figure 3A:
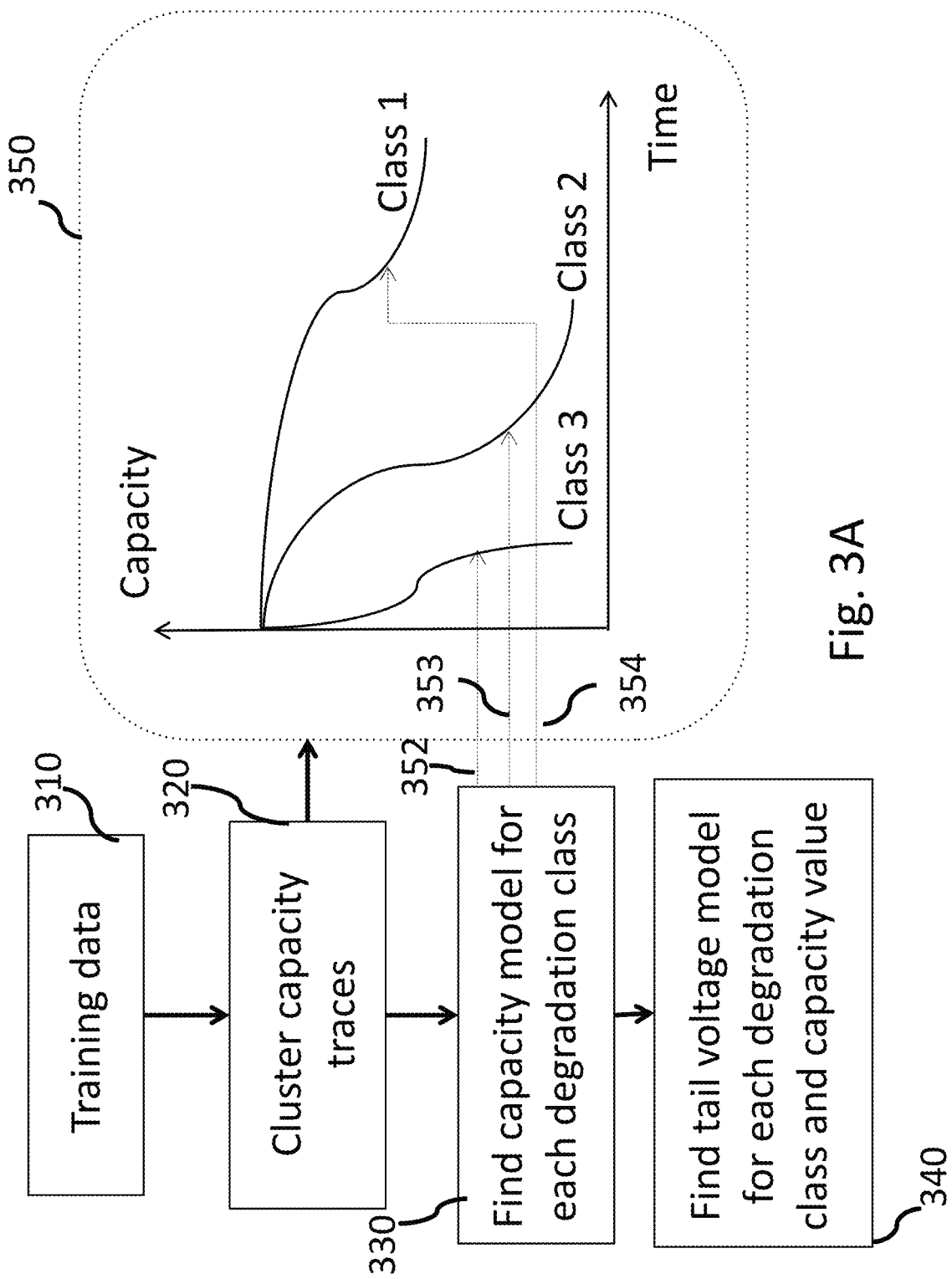
FIG. 3A shows a principle block diagram of an offline model learning stage according to some embodiments.

FIG. 3A shows a principle block diagram of the offline model learning stage according to some embodiments. Assuming N battery cells undergo a sequence of charge-discharge cycles, the training data 310 includes capacity $C_n(t)$ and tail voltage measurements $V_n(\tau, t)$, where $n=1, \ldots, N$ is battery cell index, t is "global time", i.e., discharge cycle index, and $\tau$ is "local time", i.e., discharge cycle time. In general, the number of possible degradation mechanisms is finite and thus, if N is large enough, some of the capacity traces $C_n(t)$ exhibit similar patterns. Therefore, to extract a representative set of possible capacity degradation patterns, the collected capacity traces may be clustered 320 into a certain number of clusters, i.e., degradation classes K. As a result of clustering, each cluster is represented with its own capacity model 330 $\tilde{C}_d(t)$ where $d=1, \ldots, K$ is a degradation class index. For example, it may be revealed that the capacity traces from the training dataset originate from three possible classes where each class, Class 1, Class 2 and Class 3, is represented with its own capacity trace/capacity degradation model 352, 353, 354, respectively.

Figure 3B:
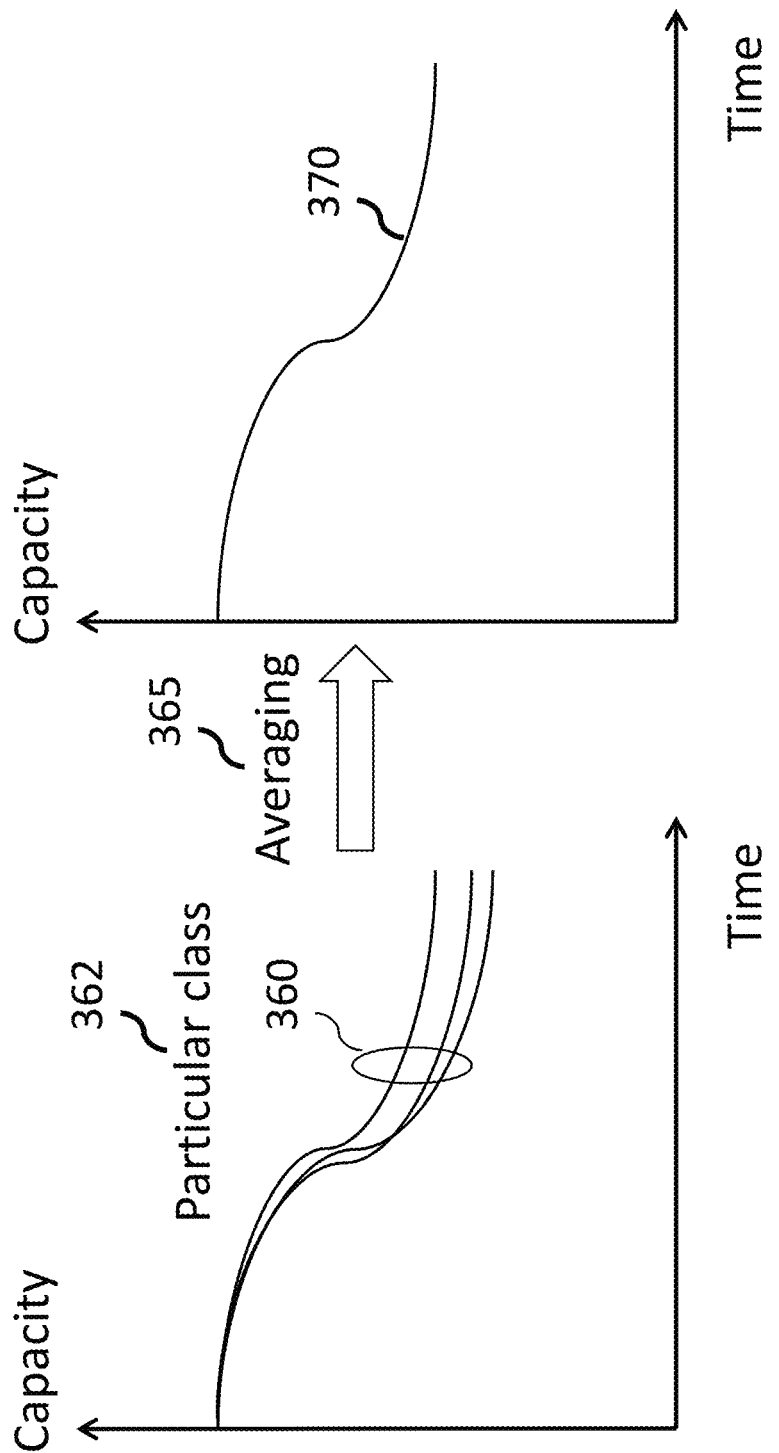
FIG. 3B shows a schematic of a method for determining capacity degradation model of a degradation class according to one embodiment.

FIG. 3B shows a schematic of a method for determining capacity degradation model of a degradation class according to one embodiment. This embodiment determines a capacity degradation model of a given class as an average all capacity traces associated with that class. Namely, all capacity traces 360 that are associated with a particular class d, are averaged 365 to yield a capacity trace model 370 for that class.

Additionally, or alternatively, in one embodiment, capacity traces associated with a particular class are used to fit model parameters of some chosen empirical model to yield the capacity model for that class. In the case of relatively small number of cells N with fairly distinct capacity traces $C_n(t)$, each capacity trace may represent one possible cluster. Additionally, or alternatively each capacity trace can be associated with its own class and used to represent capacity variation model for that class.

Figure 3C:
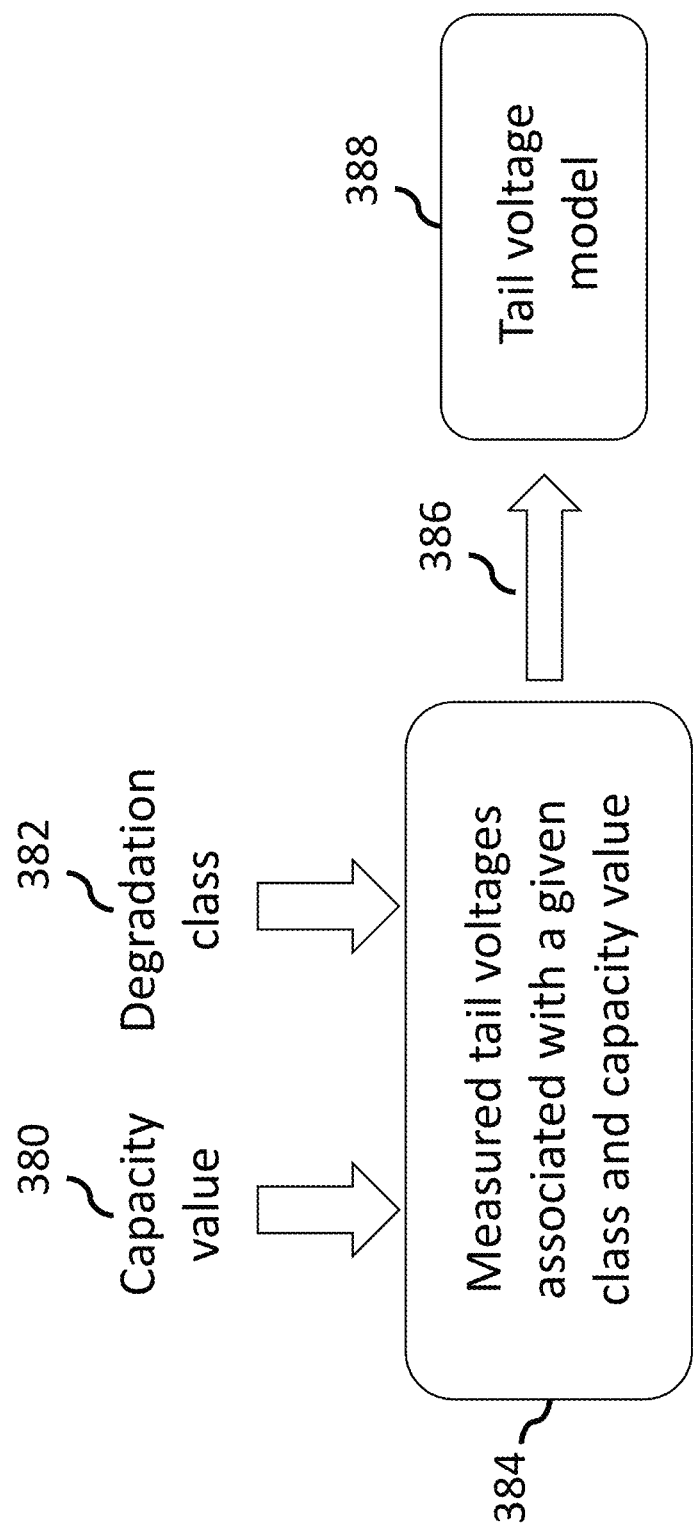
FIG. 3C shows a block diagram of a method for determining tail voltage model for a given capacity according to some embodiments.

FIG. 3C shows a principle block diagram of a method for determining tail voltage model for a given capacity and tail voltage according to some embodiments. As indicated in Eq. (2), tail voltage depends on degradation class d and capacity C. Therefore, a model for tail voltage $\tilde{V}_d(\tau, C)$ 340 is learned for each degradation class d and battery cell capacity C using the training dataset. As illustrated in FIG. 3C, all tail voltages of battery cells clustered in the same degradation class 382 and measured during the discharge cycles when the corresponding battery cells has similar capacity value 380 are grouped together and processed with the goal to learn 386 a common tail voltage model 388 corresponding to the capacity value 380 and degradation class 382. One approach to learn tail voltage models is to average measured tail voltages of the battery cells associated to the same degradation class d and recorded when the corresponding capacities are within small ε of C.

Alternatively, model learning 386 can include fitting an empirical tail voltage model with measurements 384. In the case when a capacity trace represents one possible degradation class, each measured tail voltage of such a battery cell is one tail voltage model, parameterized with the corresponding capacity C.

Overall, the model learning part yields K degradation classes with capacity models $\tilde{C}_d(t)$ and tail voltage models $\tilde{V}_d(\tau, C)$ for each admissible capacity value C (in other words, C is the range of $\tilde{C}_d(t)$).

Online Prediction

Figure 4A:
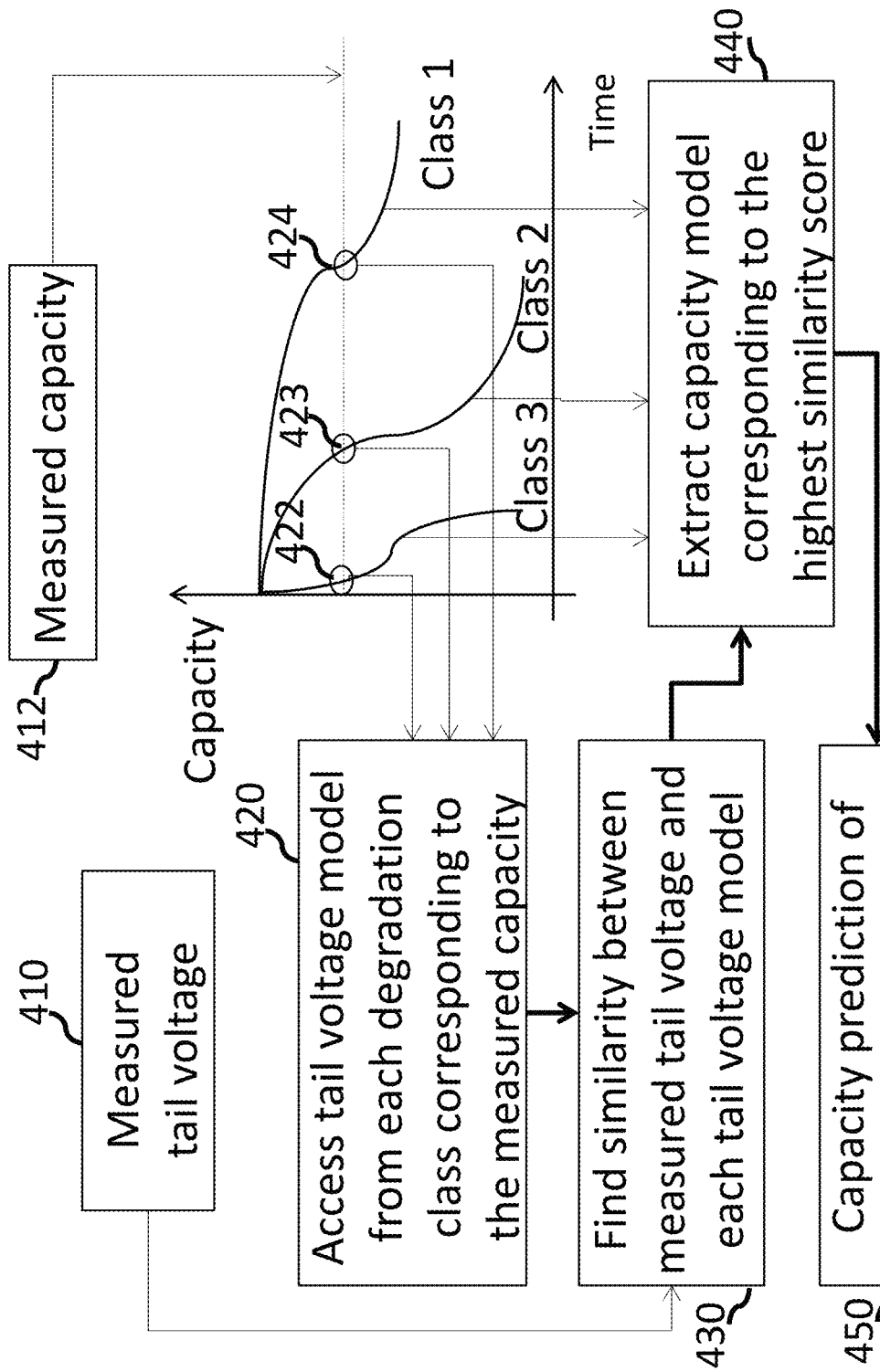
FIG. 4A shows a block diagram of a method for estimating capacity degradation of a test battery in an online stage according to one embodiment.

FIG. 4A shows a principle block diagram of a method for estimating capacity evolution/degradation of a test battery in the online stage according to one embodiment. The objective of the online stage is to predict how capacity of a tested battery cell will change in future charge-discharge cycles based on measurements of its tail voltage V(t) 410 and capacity C 412 during the most recent discharge cycle. The capacity C can be directly measured or computed based on discharge current, which is measured or known in advance as part of the discharge cycle protocol. Essentially, the online prediction stage aims to determine degradation class of the tested cell. Then, the cell's capacity trace is predicted as the capacity model associated with the detected degradation class.

Given the measured capacity value, the disclosed method first accesses tail voltage models 420 corresponding to all degradation classes at the measured capacity 422, 423, 424. The models 420 are determined in the model learning stage. Following this step, the next step in the online prediction stage comprises of determining a similarity 430 between the measured tail voltage V(τ) and tail voltage models of all degradation classes that correspond to the measured capacity C. More formally, $$S_d = \mathcal{S}(V(\tau), \tilde{V}_d(\tau, C)) \quad (3)$$

where d=1, . . . , K and $\mathcal{S}$ is a similarity operator. An example of the similarity metric is $$S_d \propto \exp\{-\|V(\tau) - \tilde{V}_d(\tau, C)\|_2^2\}, \quad (4)$$

where V(τ) and $V_d(\tau, C)$ are discretized and formatted into vectors, and $\|\ \|_2$ denotes the L2 norm of a vector. An example of similarity scores in shown in FIG. 4C which plots similarity score corresponding to tested battery Cell 7 from our dataset. As indicated by the plot 460, Cell 7 exhibits the highest similarity scores with Cell 6 462, Cell 17 464 and Cell 16 466, while the scores corresponding to other cells are negligible.

The similarities $S_d$ are normalized so that $\Sigma_{d=1}^K S_d = 1$. The resulting similarity $S_d$ can be viewed as a likelihood that the tested battery cell belongs to degradation class d. Hence, a hard decision 440 on degradation class the tested battery cell belongs to is obtained as $$\hat{d} = \underset{d}{\arg\max}\, S_d \quad (5)$$

Finally, the capacity trace 450 of the tested battery cell is the capacity model corresponding to the detected degradation class $\hat{d}$, $$C_h(t) = \tilde{C}_{\hat{d}}(t) \quad (6)$$

Capacity prediction (6) implicitly assumes that all possible degradation classes are gleaned from the training data in the model learning stage. However, this may not be the case especially when measurement log of a relatively small number of battery cells N is recorded.

Figure 4B:
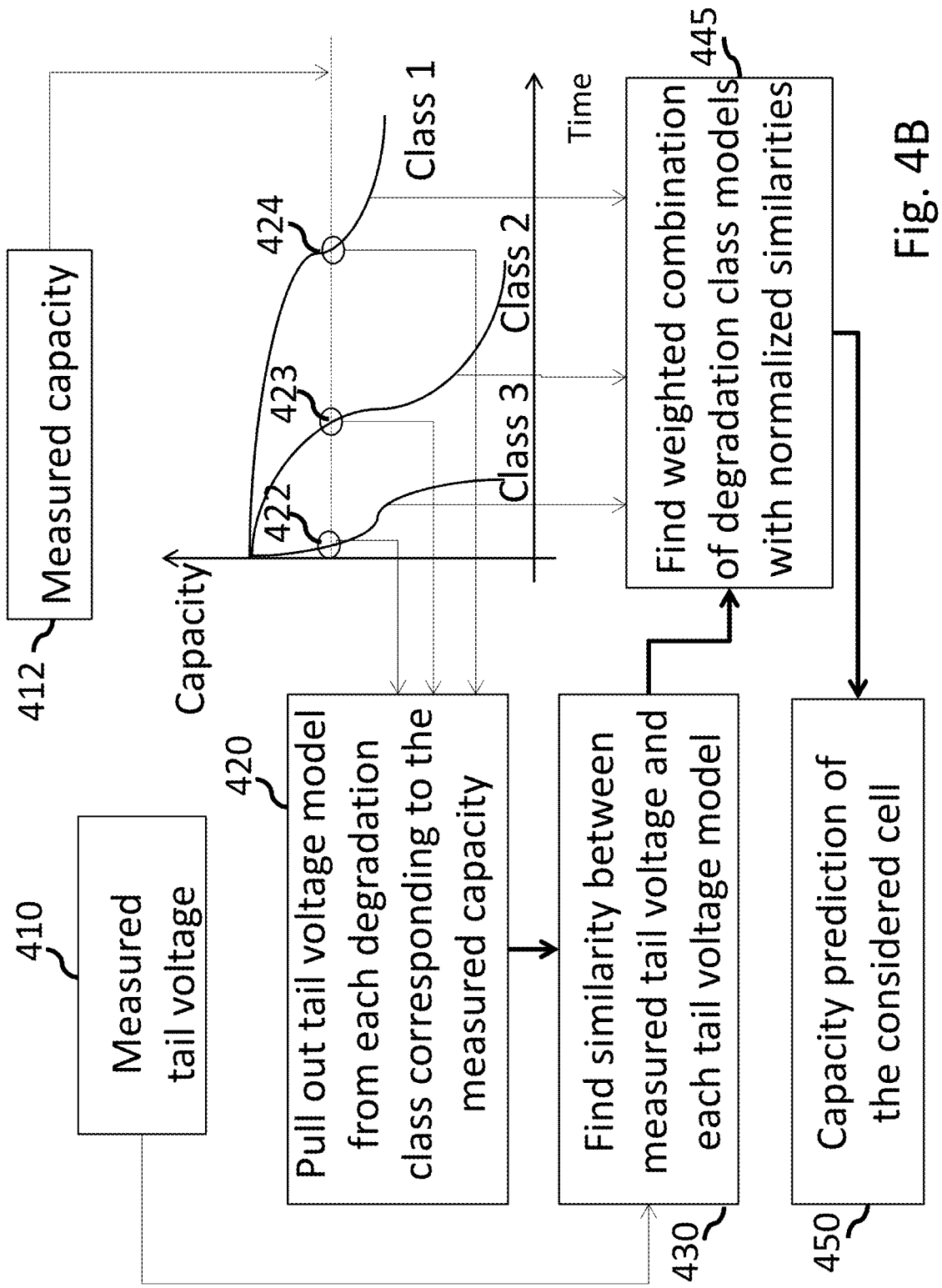
FIG. 4B shows a block diagram of a method for soft estimation of capacity degradation of a test battery according to one embodiment.
Figure 4C:
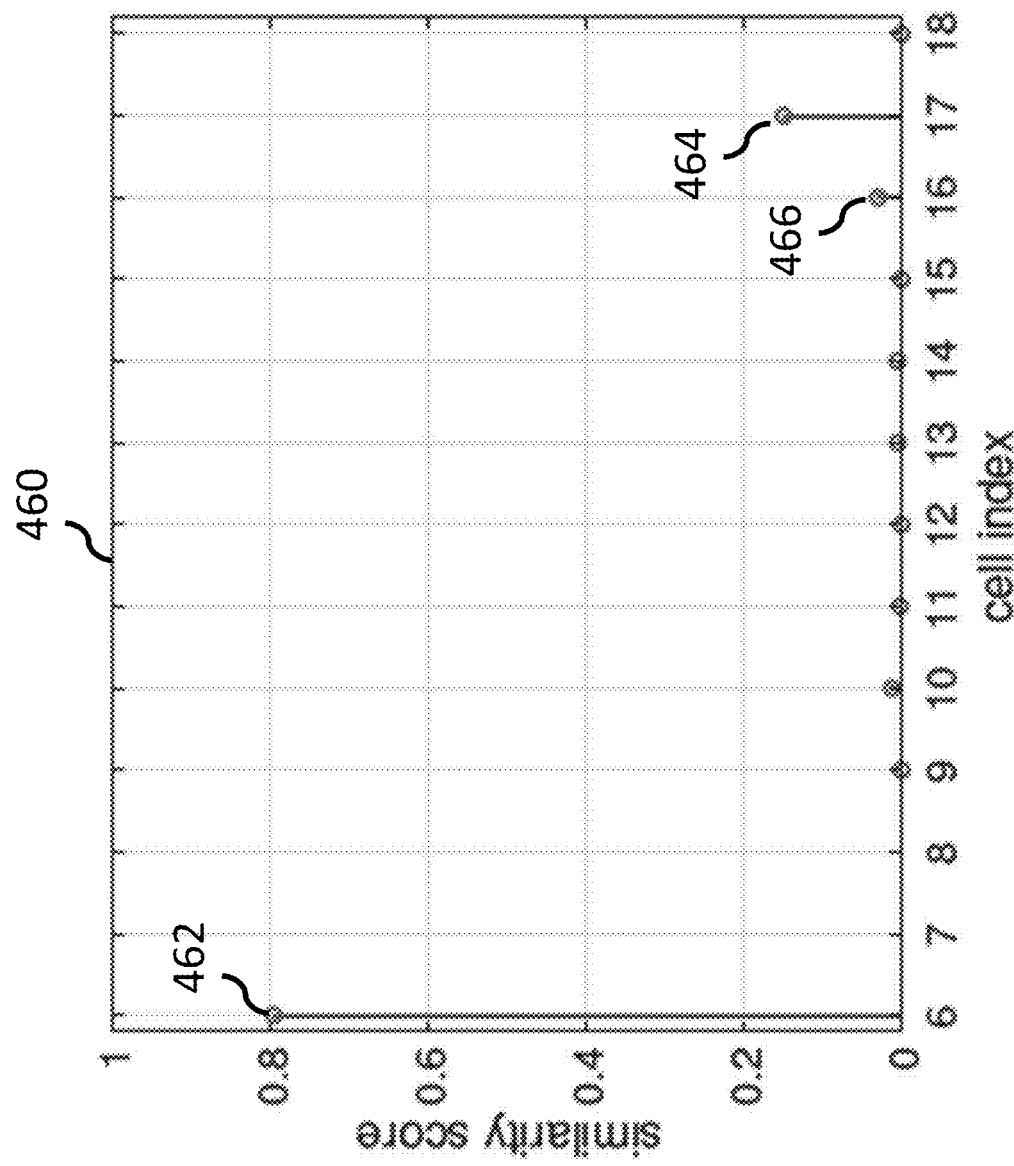
FIG. 4C shows an example of similarity scores according to one embodiment.

FIG. 4B shows a principle block diagram of a method for soft estimation of capacity degradation of a test battery according to one embodiment. The soft estimation 450 of capacity degradation of the tested battery cell is a weighted combination 445 of all capacity models $\tilde{C}_d(t)$ according to their similarities $S_d$ such that $$C_s(t) = \Sigma_{d=1}^K S_d \tilde{C}_d(t) \quad (7)$$

For example, during the soft estimation, the embodiment selects a subset of the battery cycle models closest to the battery cycle of the test battery; retrieves a subset of capacity degradation models corresponding to the selected subset of battery cycle models; and estimates the future degradation of the capacity of the battery based on a combination of the retrieved subset of capacity degradation models. For example, in one implementation, the combination is a weighted combination of the retrieved subset of capacity degradation models with weights corresponding to distances between the battery cycle of the test battery and the selected battery cycle models.

Exemplar Implementations of Model Learning

Referring to FIG. 3A, the offline/online capacity degradation methodology involves clustering capacity traces 320 recorded over charge-discharge cycles of a number of battery cells as part of the model learning in the training stage. When the number of battery cells that contribute to the training data is relatively small, each recorded capacity trace is associated with one possible degradation class and used as the corresponding capacity degradation model. In general, if the number of examined battery cells is relatively large, various clustering methods can be used. Since the number of possible degradation classes is not known in advance, Dirichlet Process Mixture Model (DPMM) is one possibility as it has a built-in mechanism to automatically detect the number of clusters.

For example, the tail voltage model 340 for each degradation class and admissible capacity value from that class can be obtained by simple averaging the measured tail voltages associated with the same class and capacity value. In general, other approaches for modelling tail voltages are suitable for the proposed prediction methodology. As such, the tail voltage model for each degradation class and capacity value can be obtained by empirical curve fitting using the set of corresponding tail voltage measurements. More generally, a capacity trace of a battery cell, along with its recorded tail voltages, can be treated as a data point in the clustering stage. In such a case, the clustering automatically yields degradation classes with the models for capacity traces and tail voltages. The DPMM model is one possible approach.

Some embodiments use battery capacity and tail voltage to learn capacity degradation models and predict capacity evolution of a test battery. Additionally, or alternatively, some embodiments use other measurements. For example, since voltage measurements during charge cycles also contain battery degradation information, they can replace tail voltages. More generally, voltage waveform recorded during a charge cycle and the following discharge cycle is another type of measurement that, along with the battery cell capacity, can be used for capacity prediction. The prediction methodology of various embodiments does not conceptually change irrespective of the type of the utilized voltage measurements. Namely, the voltage waveform still depends on the degradation class and capacity, as modelled in (2). Consequently, its model is learned for each degradation class and capacity value in the training stage.

Additionally, or alternatively to charging and discharging a battery cell with constant current, a variety of other charge and discharge protocols can be used. In such cases, all quantities (charge and discharge voltage and current) whose waveforms are not fixed by the charge-discharge protocol should be measured and utilized for the prediction task. This is because the variations of all those quantities over charge-discharge cycles depend on degradation and can be leveraged to accurately predict capacity evolution of a tested battery.

Also, measurements of current and/or voltage during more than one consecutive charge and/or discharge cycles can be taken and used to aid capacity prediction provided that the capacity does not considerably change over those cycles. As in the previous case, the proposed methodology is amenable to be generalized to accommodate such an approach.

Exemplar Experimental Validation

Some embodiments validate the proposed prediction methodology using the experimental battery dataset described. Since Cell 7 is among battery cells with longer measurement log, this cell is considered is a test battery cell. The measurements corresponding to other battery cells comprise the training dataset, with the exception of Cell 8 which is excluded from the dataset due to its quite atypical and unhealthy capacity evolution.

The exemplar experimental evaluation, based on capacity and tail voltage of Cell 7 corresponding to a certain discharge cycle t are available, predicts using the disclosed method how its capacity evolves in future discharge cycles, and compares the prediction with the available measurements of Cell 7's capacity. We compute relative errors over prediction horizons where the starting discharge cycle corresponds to different stages of Cell 7's life.

The measurement log of Cell 7 contains measurements from charge-discharge cycles taken during 39 non-uniformly sampled test days over its lifetime. For an illustration of the experimental evaluation, we predict capacity evolution of the cell using the capacity and tail voltage measurements taken during the 20th such a day, which in turn correspond to 344th day in the cell's life. As previously elaborated, each capacity trace from the training dataset represents one possible degradation class. Similarly, each measured tail voltage from the training dataset is tail voltage model for the corresponding degradation class and capacity value. The amount of charge Cell 7 delivers during its discharge cycle, i.e., its measured capacity, on its 344th day is 2.7135 Ah. The similarity score between Cell 7's tail voltage during that discharge cycle and measured tail voltages from the training dataset associated with capacities from the range around 2.7135 Ah of width 0.1 Ah are computed using (3). Their plot in FIG. 4C suggests that the tail voltage of the test cell exhibits similar behavior to tail voltage corresponding to degradation class represented by Cell 6 and, and to some extent degradation class of Cell 17 and Cell 16. Consequently, as given in (7), the capacity trace of the tested cell is predicted as the weighted combination of capacity traces of the degradation classes (i.e., battery cells from the training dataset), where the weights are the similarity scores. Since not all cells from our dataset undergo test charge/discharge cycles, the similarity scores corresponding to cells with missing capacity measurements on a considered discharge cycle are assumed zero and the remaining similarity scores are re-normalized.

Figure 5A:
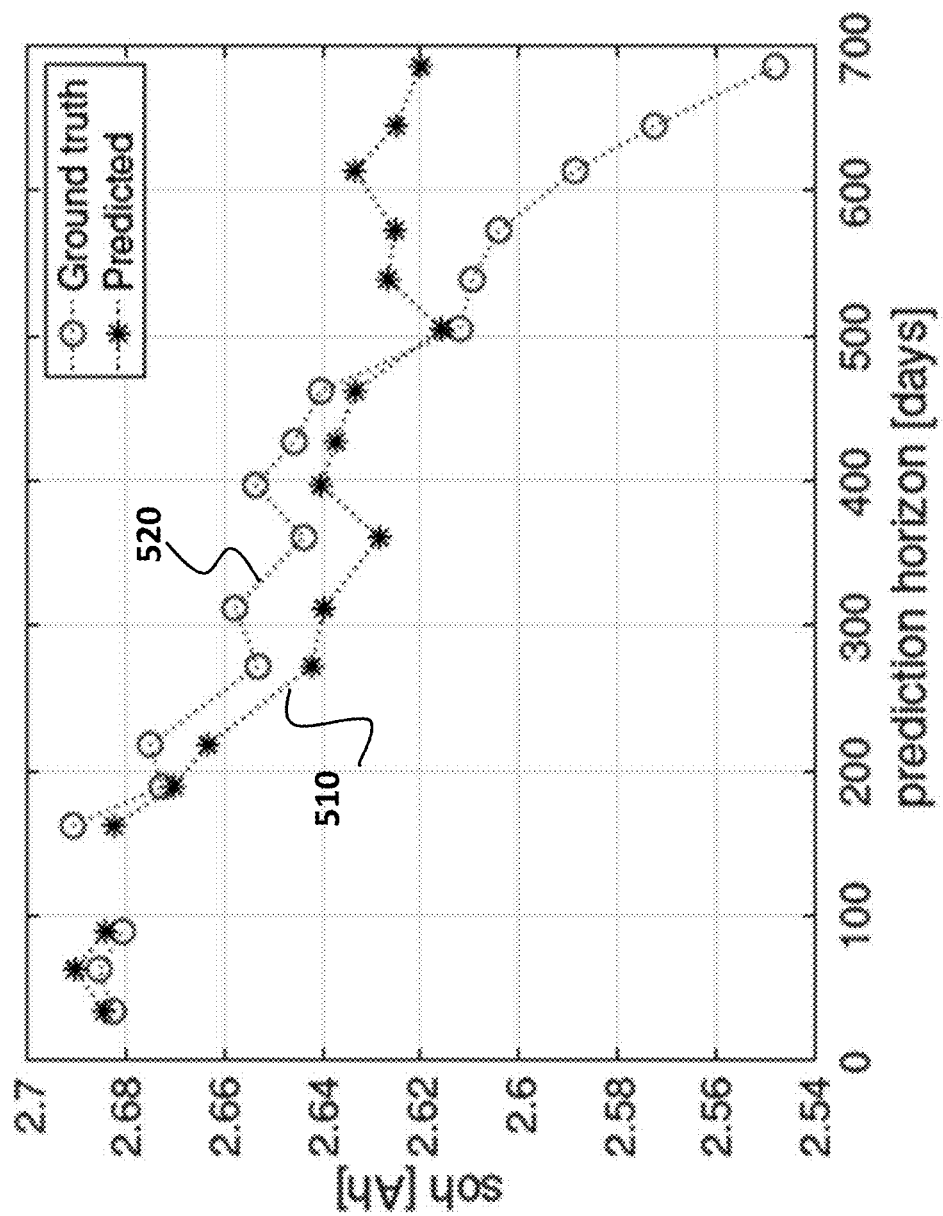
FIG. 5A shows a comparison diagram between the estimated and ground truth capacity degradation determined according to principles of some embodiments.

FIG. 5A shows a comparison diagram between the estimated and ground truth capacity degradation determined according principles of some embodiments. The horizontal axis represents the prediction horizon with respect to the reference day on which discharge cycle measurements that aid capacity prediction are recorded. As can be seen, the estimated (predicted) capacity 510 is fairly close to the ground truth 520 more than 500 days ahead of the reference day (when the discharge cycle measurements were taken).

Figure 5B:
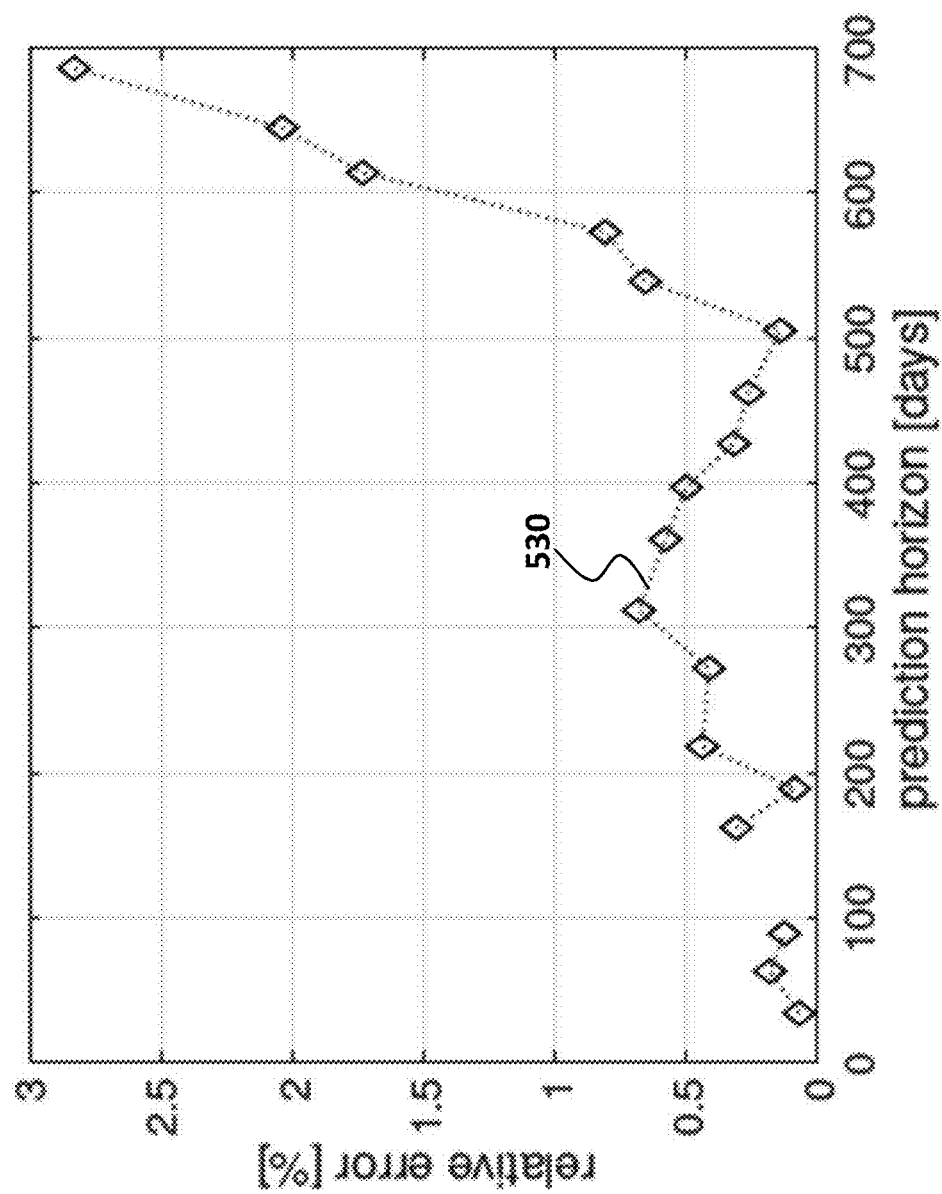
FIG. 5B shows a graph of a relative error of capacity estimation over future time horizon performed by one of the embodiments.

FIG. 5B shows a graph 530 of a relative error of capacity estimation over future time horizon performed by one of the embodiment. The relative prediction error, shown in FIG. 5B, does not exceed 3% over the prediction time horizon, and is below 1% within first 600 days ahead of the reference day.

Figure 5C:
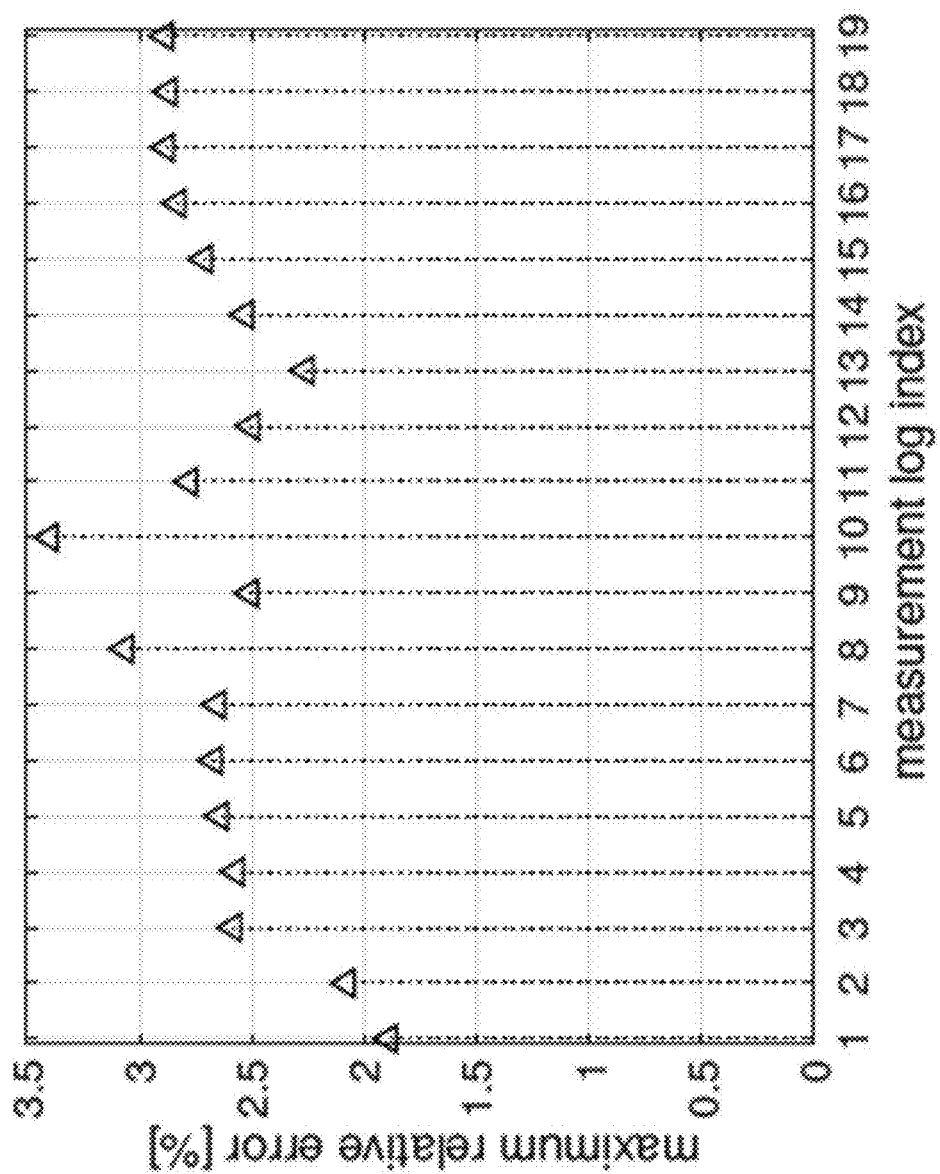
FIG. 5C shows a plot of maximum relative error of capacity prediction obtained by one embodiment for one battery cell and different discharge cycle measurements.

FIG. 5C shows a plot for maximum relative error of capacity prediction obtained by one embodiment for one battery cell and different discharge cycle measurements.

As the index of the measurement log increases, the associated discharge cycle happens later in the cell's life so that the prediction time horizon is shorter. As such, the prediction time horizons for the maximum relative error from FIG. 5C range from 959 days down to 597 days in the future. Notably, the maximum relative error, occurring towards the end of the corresponding prediction time horizon just as in FIG. 5B, is below 3% for all but two discharge cycle logs.

Exemplary Embodiments

Figure 6:
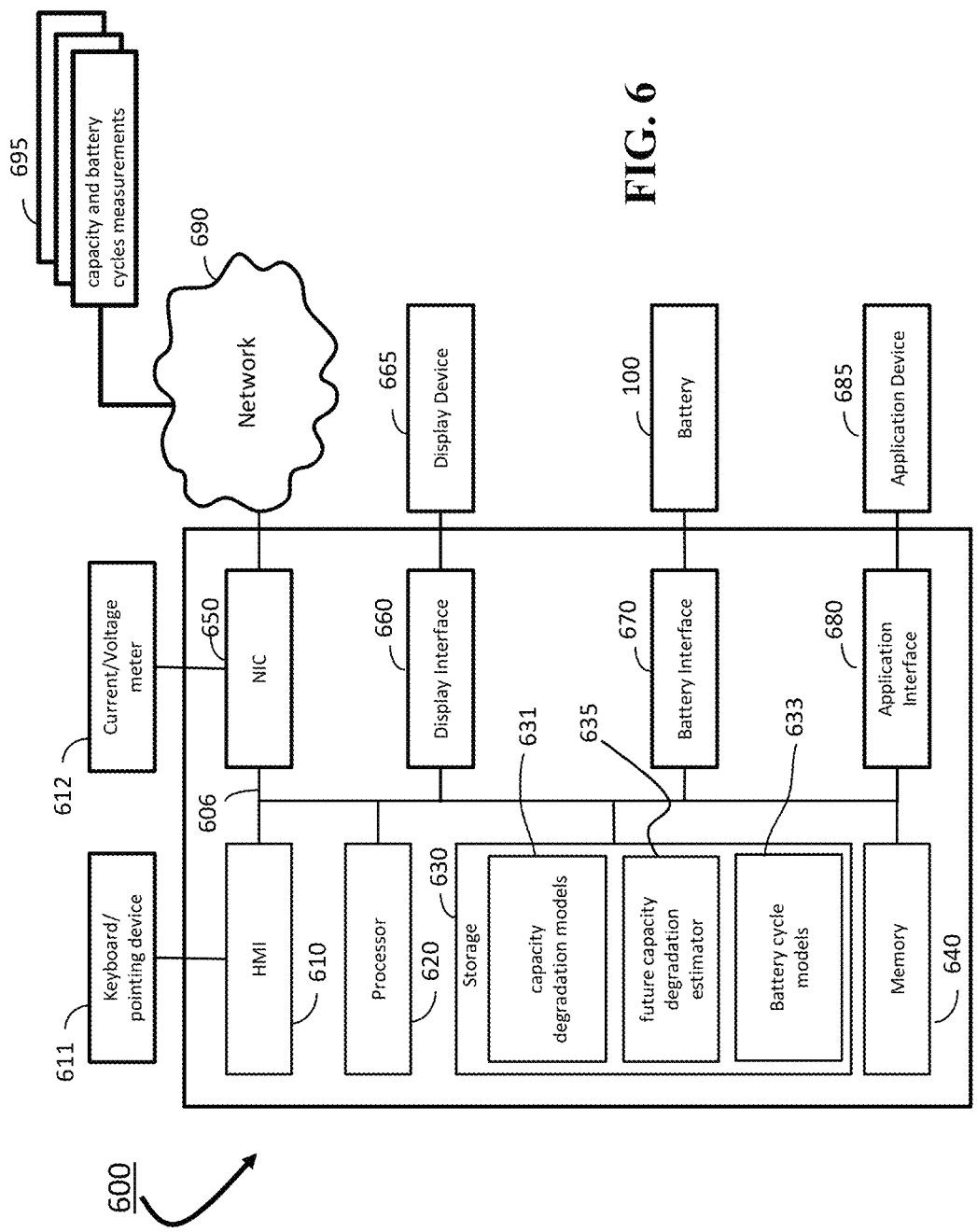
FIG. 6 shows a block diagram of a battery diagnostic system for estimating future degradation of the capacity of the test battery in accordance with some embodiments.

FIG. 6 shows a block diagram of a battery diagnostic system 600 for estimating future degradation of the capacity of the test battery in accordance with some embodiments. The battery diagnostic system 600 includes a processor 620 configured to execute stored instructions, as well as a memory 640 that stores instructions that are executable by the processor. The processor 620 can be a single core processor, a multi-core processor, a computing cluster, or any number of other configurations. The memory 640 can include random access memory (RAM), read only memory (ROM), flash memory, or any other suitable memory systems. The processor 620 is connected through a bus 606 to one or more input and output devices. These instructions implement a method 635 for estimating future degradation of the capacity of the test battery.

In different implementations, the battery diagnostic system 600 can have different types and combination of input interfaces to accept measurements indicative of a battery cycle and a current capacity of the test battery 100. In one implementation, a human machine interface 610 within the battery diagnostic system 600 connects the system to a keyboard and/or pointing device 611, wherein the pointing device 611 can include a mouse, trackball, touchpad, joy stick, pointing stick, stylus, or touchscreen, among others.

Additionally, or alternatively, the battery diagnostic system 600 can be connected to a battery interface 670 adapted to connect the system to the test battery 100. The test battery 100 is an electric battery that can include one or more electrochemical cells with external connections provided to power electrical devices such as flashlights, smartphones, and electric cars. The battery interface 670 can be adapted to measure parameters of the test battery 100 such as voltage and current of the battery during its charging and/or discharging cycles.

Additionally, or alternatively, a network interface controller 650 can be adapted to connect the battery diagnostic system 600 through the bus 606 to a network 690. Through the network 690, the measurements 695 indicative of a battery cycle and a current capacity of the test battery 100 can be downloaded and stored within the computer's storage system 630 for storage and/or further processing.

In addition to input interface, the battery diagnostic system 600 can include one or multiple output interfaces to output the estimated future degradation of the capacity of the test battery. For example, the battery diagnostic system 600 can be linked through the bus 606 to a display interface 660 adapted to connect the battery diagnostic system 600 to a display device 665, wherein the display device 665 can include a computer monitor, camera, television, projector, or mobile device, among others.

Additionally, or alternatively, the battery diagnostic system 600 is connected to an application interface 680 through the bus 606 adapted to connect the battery diagnostic system 600 to an application device 685 that can operate based on results of battery diagnostic. For example, the device 685 is a surveillance system that uses the results of diagnostic to alert a user to investigate further and/or to replace the test battery.

The battery diagnostic system 600 is configured to estimate capacity degradation 635 using trained in advance capacity degradation models 631 and battery cycle models 633. Each capacity degradation model defines degradation of a battery capacity as a function of time. Each battery cycle is modeled from values of one or combination of voltages and currents measured for the batteries of the specific type at different capacities during one or combination of a charging cycle and a discharging cycle. Examples of measurements for forming a battery cycle include tail voltage measured during a discharge cycle, current measured during a discharge cycle, voltage during a charge cycle, current during a charge cycle, voltage during a charge and the following discharge cycle, voltage during a charge and the following discharge cycle, or in general, any of voltage/current during charge/discharge that is not pre-defined in advance and is allowed to vary and thus contain degradation information. For example, a storage device 630 can be adapted to store the sets of trained models. The storage device 630 can be implemented using a hard drive, an optical drive, a thumb drive, an array of drives, or any combinations thereof.

Figure 7:
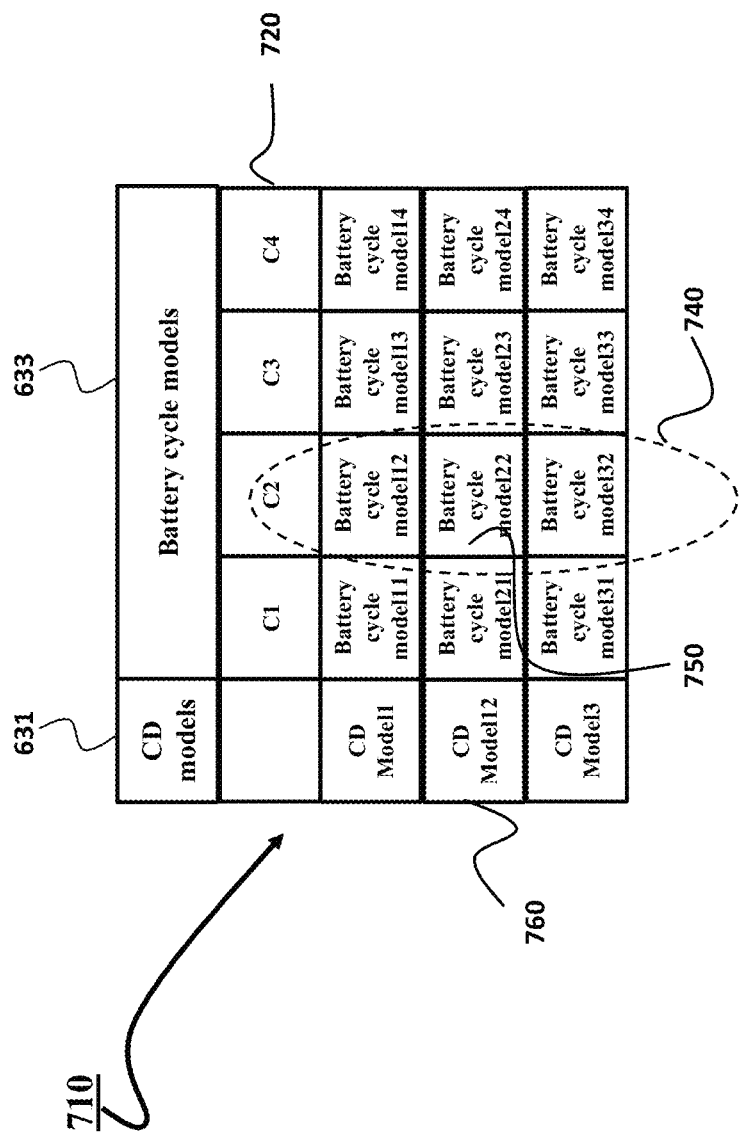
FIG. 7 shows a table with an exemplar mapping between the set of capacity degradation models and sets of battery cycles models determined for different values of capacity according to some embodiments.

FIG. 7 shows a table 710 with an example of the mapping between the set of capacity degradation models 631 and sets of battery cycles models 633 determined for different values of capacity 720 according to some embodiments. Each capacity degradation model is mapped to a set of battery cycle models 740 associated with different battery capacities.

Figure 8:
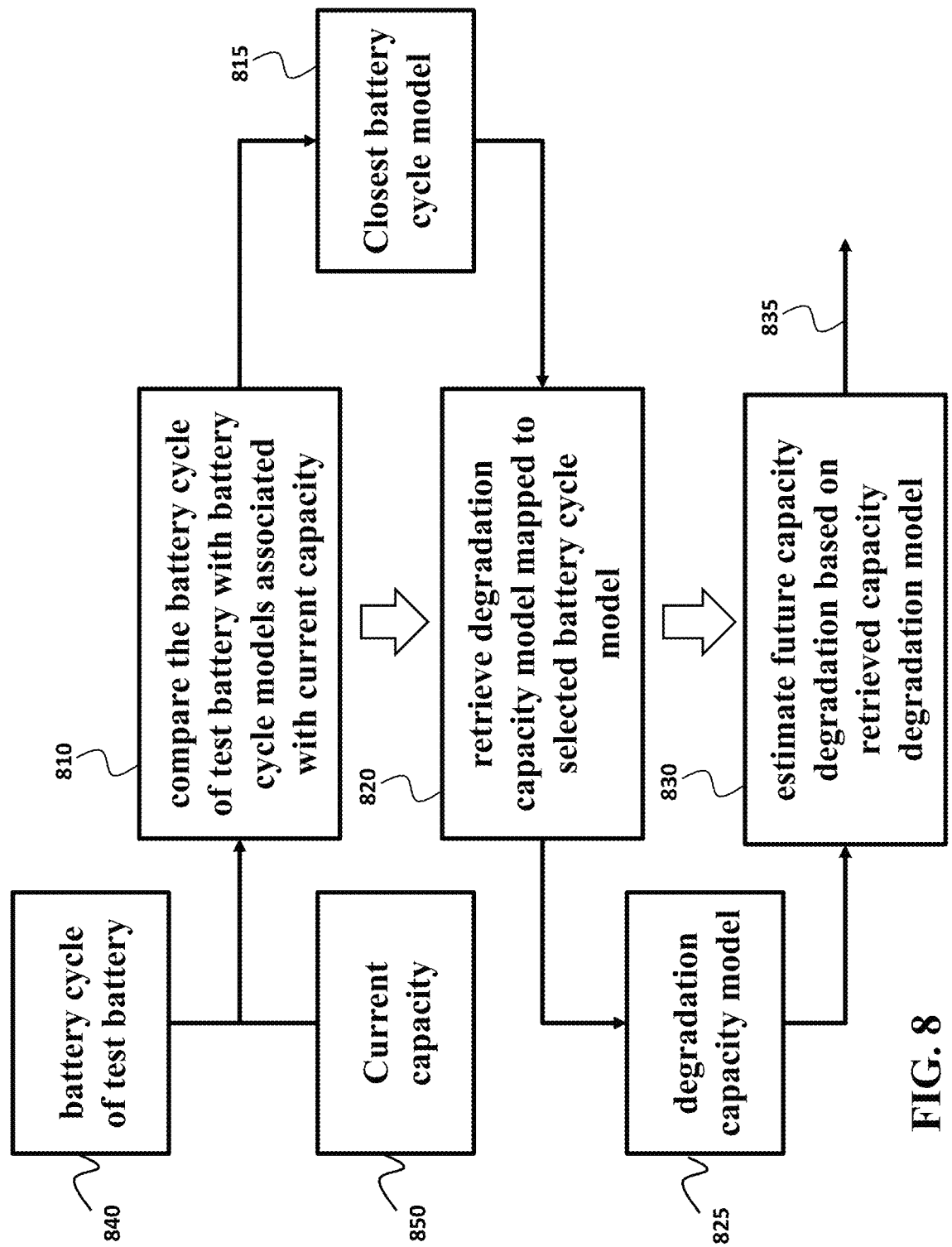
FIG. 8 shows a block diagram of a method for estimating future degradation of the capacity of a test battery according to some embodiments.

FIG. 8 shows a block diagram of a method 635 for estimating future degradation of the capacity 835 of a test battery according to some embodiments. The method 635 uses the mapping 710 to determine online to which degradation class the test battery 100 belong and/or which capacity degradation model to use for estimating the future degradation of the capacity of a test battery.

The method compares 810 the battery cycle 840 of the test battery with the battery cycle models of different capacity degradation models associated with a value of the test battery capacity 850 closest to the current capacity of the test battery. For example, the capacity of the test battery is closest to a value C2 in table 710. Hence, in this example, the method compares 810 the battery cycle 840 of the test battery with the battery cycle models 740 to select at least one battery cycle model 815 closest to the battery cycle of the test battery. As discussed, the battery cycles can be formed in different manners. However, the battery cycle models determined offline and a battery cycle of a test battery received for the diagnostic are determined in the same manner. For example, the battery cycle models and the battery cycle of the test battery can be form with values of tail voltages.

The method retrieves 820 from the memory the degradation capacity model 825 mapped to the selected battery cycle model and estimates 830 future degradation of the capacity 835 of the battery based on the retrieved capacity degradation model. If, for example, the battery cycle model 750 is the closest 815 to the battery cycle 840 of the test battery, the method uses the capacity degradation model 760 to estimate future degradation of the capacity of the test battery. In effect, battery cycle models allow to use measurements of the test battery to estimate its degradation class regardless of usage pattern of the test battery.

The above-described embodiments of the present invention can be implemented in any of numerous ways. For example, the embodiments may be implemented using hardware, software or a combination thereof. When implemented in software, the software code can be executed on any suitable processor or collection of processors, whether provided in a single computer or distributed among multiple computers. Such processors may be implemented as integrated circuits, with one or more processors in an integrated circuit component. Though, a processor may be implemented using circuitry in any suitable format.

Also, the embodiments of the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Use of ordinal terms such as "first," "second," in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Although the invention has been described by way of examples of preferred embodiments, it is to be understood that various other adaptations and modifications can be made within the spirit and scope of the invention.

Therefore, it is the object of the appended claims to cover all such variations and modifications as come within the true spirit and scope of the invention.

The invention claimed is:

1. A battery diagnostic system, comprising:
  a memory configured to store a set of capacity degradation models for batteries of a specific type, each capacity degradation model defines degradation of a battery capacity as a function of time, mapped to sets of battery cycle models formed by values of one or combination of voltages and currents measured for the batteries of the specific type at different capacities during one or combination of a charging cycle and a discharging cycle, such that each capacity degradation model is mapped to a set of battery cycle models associated with different battery capacities;

an input interface configured to accept measurements indicative of a battery cycle of a test battery and a current capacity of the test battery;

a processor configured to
compare the battery cycle of the test battery with the battery cycle models of different capacity degradation models associated with a value of the battery capacity closest to the current capacity of the test battery to select at least one battery cycle model closest to the battery cycle of the test battery;
retrieve from the memory the degradation capacity model mapped to the selected battery cycle model; and
estimate future degradation of the capacity of the test battery based on the retrieved capacity degradation model; and an output interface configured to output the estimated future degradation of the capacity of the test battery.

2. The battery diagnostic system of claim 1, wherein the battery capacity indicates a capacity of the battery to deliver an amount of charge for a period of time.

3. The battery diagnostic system of claim 1, wherein the future degradation of the capacity includes a section of the retrieved capacity degradation model starting at the current capacity of the test battery.

4. The battery diagnostic system of claim 1, wherein the input interface receives measurements of a discharge current of the battery, and wherein the processor determines the current capacity as being proportional to an integral of the measurements of the discharge current over a period of time with a constant of proportionality defined by the specific type of the battery.

5. The battery diagnostic system of claim 1, wherein the battery cycle models are formed from measurements of tail voltage of the batteries, and wherein the input interface accepts measurements of the tail voltage of the test battery.

6. The battery diagnostic system of claim 1, wherein the processor is configured to
select a subset of the battery cycle models closest to the battery cycle of the test battery;
retrieve a subset of capacity degradation models corresponding to the selected subset of battery cycle models; and
estimate the future degradation of the capacity of the battery based on a combination of the retrieved subset of capacity degradation models.

7. The battery diagnostic system of claim 6, wherein the combination is a weighted combination of the retrieved subset of capacity degradation models with weights corresponding to distances between the battery cycle of the test battery and the selected battery cycle models.

8. The battery diagnostic system of claim 1, wherein the measurements of the test battery are determined under the same conditions as measurements for determining the set of capacity degradation models and the sets of battery cycle models.

* * * * *